(12) United States Patent
Takahashi

(10) Patent No.: US 10,236,795 B2
(45) Date of Patent: Mar. 19, 2019

(54) PIEZOELECTRIC DRIVING DEVICE FOR MOTOR, MOTOR, ROBOT, AND PUMP

(71) Applicant: Seiko Epson Corporation, Tokyo (JP)

(72) Inventor: Tomoaki Takahashi, Matsumoto (JP)

(73) Assignee: Seiko Epson Corporation (JP)

( * ) Notice: Subject to any disclaimer, the term of this patent is extended or adjusted under 35 U.S.C. 154(b) by 251 days.

(21) Appl. No.: 15/176,470

(22) Filed: Jun. 8, 2016

(65) Prior Publication Data

US 2016/0365809 A1 Dec. 15, 2016

(30) Foreign Application Priority Data

Jun. 12, 2015 (JP) .................. 2015-119672
Jun. 12, 2015 (JP) .................. 2015-119673

(51) Int. Cl.
*H02N 2/00* (2006.01)
*B25J 9/12* (2006.01)
(Continued)

(52) U.S. Cl.
CPC .............. *H02N 2/003* (2013.01); *B25J 9/12* (2013.01); *B25J 15/0293* (2013.01);
(Continued)

(58) Field of Classification Search
CPC ........ H02N 2/001; H02N 2/003; H02N 2/004; H02N 2/104; H02N 2/0055; H01L 41/0913
(Continued)

(56) References Cited

U.S. PATENT DOCUMENTS 5,616,980 A 4/1997 Zumeris
7,215,062 B1 * 5/2007 Iino ............... H01L 41/0913
310/323.02
(Continued)

FOREIGN PATENT DOCUMENTS

CN 103 151 951 A 6/2013
CN 103 684 036 A 3/2014
(Continued)

OTHER PUBLICATIONS

Partial European Search Report for Patent Application No. EP16173890.1 dated Mar. 13, 2017 (10 pages).
(Continued)

*Primary Examiner* — Derek Rosenau
(74) *Attorney, Agent, or Firm* — Harness, Dickey & Pierce, P.L.C.

(57) ABSTRACT

Provided is a piezoelectric driving device for a motor including: a vibrating plate which includes a fixed portion and a vibrator portion in which a piezoelectric element is provided and which is supported by the fixed portion; and a contact portion which comes into contact with a driven body and transmits motion of the vibrating plate to the driven body, in which the fixed portion, the vibrator portion, and the contact portion are provided along an X direction in this order, when seen in a Y direction, when two directions parallel to a main surface of the vibrating plate and orthogonal to each other are set as the X direction and the Y direction and a direction orthogonal to the main surface of the vibrating plate is set as a Z direction.

18 Claims, 23 Drawing Sheets

(51) Int. Cl.
  *B25J 15/02* (2006.01)
  *F04B 43/08* (2006.01)
  *F04B 43/09* (2006.01)
  *H01L 41/09* (2006.01)
  *H02N 2/10* (2006.01)

(52) U.S. Cl.
  CPC .......... *F04B 43/082* (2013.01); *F04B 43/095* (2013.01); *H01L 41/0913* (2013.01); *H02N 2/001* (2013.01); *H02N 2/004* (2013.01); *H02N 2/0055* (2013.01); *H02N 2/103* (2013.01)

(58) Field of Classification Search
  USPC ........................................ 310/323.01–323.21
  See application file for complete search history.

(56) References Cited

U.S. PATENT DOCUMENTS

| | | |
|---|---|---|
| 2012/0148429 A1 | 6/2012 | Katase |
| 2013/0140951 A1 | 6/2013 | Kamijo et al. |
| 2013/0140954 A1 | 6/2013 | Kamijo et al. |
| 2014/0015381 A1 | 1/2014 | Kikushima |
| 2014/0078219 A1 | 3/2014 | Nishimura |
| 2014/0294607 A1 | 10/2014 | Miyazaki |
| 2015/0125316 A1 | 5/2015 | Katase |
| 2015/0318801 A1* | 11/2015 | Kamijo ................ H02N 2/0075 310/323.02 |

FOREIGN PATENT DOCUMENTS

| | | |
|---|---|---|
| CN | 104 104 267 A | 10/2014 |
| JP | 03-011983 | 1/1991 |
| JP | 09-105676 | 4/1997 |
| JP | 09-135585 A | 5/1997 |
| JP | 2003-008094 A | 1/2003 |
| JP | 2004-140947 A | 5/2004 |
| JP | 2007-202398 A | 8/2007 |
| JP | 2012-122419 | 6/2012 |
| JP | 2013-240172 | 11/2013 |
| JP | 2014-233191 A | 12/2014 |

OTHER PUBLICATIONS

Extended European Search Report for Patent Application No. EP16173890.1 dated Jul. 3, 2017 (16 pages).

* cited by examiner

| MODEL | PRESSURE DIRECTION | MAXIMUM STRESS [GPa] |
|---|---|---|
| M1 | (a) X AXIS DIRECTION | 0.8 |
| M1 | (b) Y AXIS DIRECTION | 13.6 |
| M1 | (c) Z AXIS DIRECTION | 30.1 |
| M2 | (d) X AXIS DIRECTION | 1.3 |
| M2 | (e) Y AXIS DIRECTION | 7.9 |
| M2 | (f) Z AXIS DIRECTION | 47.3 |

| LENGTH α OF CUT-OUT PORTION [mm] | DEPTH β OF CUT-OUT PORTION [mm] | | | |
|---|---|---|---|---|
| | 0 | 0.1 | 0.2 | 0.3 |
| 0 | 2.37% | – | – | – |
| 0.1 | – | 1.26% | 1.02% | 1.31% |
| 0.2 | – | 1.44% | 0.56% | 0.71% |
| 0.3 | – | 1.37% | 0.49% | 0.68% |

FIG. 21

| LENGTH L2 [mm] | RESONANCE FREQUENCY [kHz] | | |
|---|---|---|---|
| | LONGITUDINAL VIBRATION | BENDING VIBRATION | Δf |
| 2.40 | 888.0 | 897.0 | −9.0 |
| 2.45 | 869.0 | 873.1 | −4.1 |
| 2.50 | 850.9 | 849.7 | 1.2 |
| 2.55 | 833.6 | 827.5 | 6.1 |
| 2.60 | 817.2 | 806.0 | 11.2 |

FIG. 22

| RATE OF CHANGE IN LENGTH L2 | RATE OF CHANGE IN RESONANCE FREQUENCY | | |
|---|---|---|---|
| | LONGITUDINAL VIBRATION | BENDING VIBRATION | Δf |
| −4% | 4.4% | 5.6% | −1.1% |
| −2% | 2.1% | 2.8% | −0.5% |
| 0% | 0.0% | 0.0% | 0.1% |
| 2% | −2.0% | 2.6% | 0.7% |
| 4% | −4.0% | 5.1% | 1.3% |

FIG. 26

| LENGTH L1 [mm] | WIDTH W [mm] | THICKNESS T [mm] | SECTIONAL AREA OF VIBRATOR PORTION [mm²] | LENGTH α OF CUT-OUT PORTION [mm] | DEPTH β OF CUT-OUT PORTION [mm] | SECTIONAL AREA OF CONNECTION PORTION [mm²] | DECREASING RATE OF SECTIONAL AREA A | CUTOUT LENGTH RATE B | A×B | Δf<sub>SUM</sub> |
|---|---|---|---|---|---|---|---|---|---|---|
| 2.5 | 1.030 | 0.2 | 0.206 | 0.0 | 0.0 | 0.206 | 0.00 | 0.00 | 0.000 | 2.98% |
| 2.5 | 1.082 | 0.2 | 0.216 | 0.1 | 0.1 | 0.176 | 0.18 | 0.04 | 0.007 | 1.26% |
| 2.5 | 1.109 | 0.2 | 0.195 | 0.1 | 0.2 | 0.155 | 0.21 | 0.08 | 0.016 | 1.44% |
| 2.5 | 1.139 | 0.2 | 0.162 | 0.1 | 0.3 | 0.122 | 0.25 | 0.12 | 0.030 | 1.37% |
| 2.5 | 0.975 | 0.2 | 0.222 | 0.2 | 0.1 | 0.142 | 0.36 | 0.04 | 0.014 | 1.02% |
| 2.5 | 1.005 | 0.2 | 0.201 | 0.2 | 0.2 | 0.121 | 0.40 | 0.08 | 0.032 | 0.56% |
| 2.5 | 1.035 | 0.2 | 0.177 | 0.2 | 0.3 | 0.097 | 0.45 | 0.12 | 0.054 | 0.49% |
| 2.5 | 0.811 | 0.2 | 0.228 | 0.3 | 0.1 | 0.108 | 0.53 | 0.04 | 0.021 | 1.31% |
| 2.5 | 0.886 | 0.2 | 0.207 | 0.3 | 0.2 | 0.087 | 0.58 | 0.08 | 0.046 | 0.71% |
| 2.5 | 0.961 | 0.2 | 0.192 | 0.3 | 0.3 | 0.072 | 0.62 | 0.12 | 0.075 | 0.68% |

A×B

DECREASING RATE OF SECTIONAL AREA A

| LENGTH α OF CUT-OUT PORTION [mm] | DEPTH β OF CUT-OUT PORTION [mm] | | | |
|---|---|---|---|---|
| | 0 | 0.1 | 0.2 | 0.3 |
| 0 | 850.9 | – | – | – |
| 0.1 | – | 739.4 | 688.0 | 578.4 |
| 0.2 | – | 711.8 | 660.8 | 568.2 |
| 0.3 | – | 686.3 | 635.5 | 552.0 |

PIEZOELECTRIC DRIVING DEVICE FOR MOTOR, MOTOR, ROBOT, AND PUMP

BACKGROUND

1. Technical Field

The present invention relates to a piezoelectric driving device for a motor, a motor, a robot, and a pump.

2. Related Art

Piezoelectric actuators (piezoelectric driving devices for a motor) which vibrate a piezoelectric body to drive a driven body, do not need a magnet or a coil, and accordingly, are used in various fields.

Japanese Patent No. 2847758, for example, discloses an ultrasonic motor (piezoelectric driving device for a motor) which rotates a rotor disposed to come into contact with an elastic plate by using resonance vibration in a primary longitudinal vibration mode in a longitudinal direction of the elastic plate including one fixed edge and the other free edge, and resonance vibration in a higher bending vibration mode in a longitudinal direction. In such a piezoelectric driving device, it is possible to efficiently rotate a rotor by decreasing a difference between a resonance frequency in longitudinal vibration and a resonance frequency in bending vibration (transverse vibration).

JP-A-2004-140947, for example, discloses a driving device including a vibrating plate including a piezoelectric element, an arm portion supporting the vibrating plate, and a fixed plate vibratably supporting the vibrating plate via the arm portion, in which the arm portion supports the approximate center of the vibrating plate in a longitudinal direction at two supporting points from both sides.

However, in the piezoelectric driving device disclosed in Japanese Patent No. 2847758, a rotor is disposed so as to come into contact with a main surface of a vibrating plate (an upper surface of a vibrating plate). Accordingly, in the piezoelectric driving device disclosed in Japanese Patent No. 2847758, since the vibrating plate is pressed in a vertical direction of the main surface of the vibrating plate, the vibrating plate may be damaged due to concentration of stress on a boundary between a fixed portion (portion interposed by a jig of the vibrating plate) and a vibrating portion of the vibrating plate. Thus, a force for pressing the vibrating plate is hardly increased and output may not be increased.

In addition, in the piezoelectric driving device disclosed in JP-A-2004-140947, the arm portion supporting the vibrating plate is a thin and long member so as not to disturb vibration of the vibrating plate, and the arm portion may be damaged due to stress (shear stress) applied to such a thin and long member, for example. Thus, a force for pressing the vibrating plate is hardly increased and output may not be increased.

SUMMARY

An advantage of some aspects of the invention is to provide a piezoelectric driving device for a motor capable of realizing high output. Another advantage of some aspects of the invention is to provide a motor, a robot, and a pump including the piezoelectric driving device for a motor.

In such a piezoelectric driving device, when a position of a vibrating plate with respect to a fixation member varies (is deviated from a desired position) when attaching the vibrating plate (elastic plate) to the fixation member, a difference between a resonance frequency of longitudinal vibration and a resonance frequency of bending vibration may be increased. Accordingly, a rotor may not be efficiently rotated. In addition, variations in characteristics of the piezoelectric driving device may increase.

Still another advantage of some aspects of the invention is to provide a piezoelectric driving device for a motor in which a difference between a resonance frequency of longitudinal vibration and a resonance frequency of bending vibration hardly increases, even when a position of a vibrating plate with respect to a fixation member varies. Still another advantage of some aspects of the invention is to provide a motor, a robot, and a pump including the piezoelectric driving device for a motor.

The invention can be realized in the following aspects or application examples.

APPLICATION EXAMPLE 1

According to an aspect of the invention, there is provided a piezoelectric driving device for a motor, including: a vibrating plate which includes a fixed portion and a vibrator portion in which a piezoelectric element is provided and which is supported by the fixed portion; and a contact portion which comes into contact with a driven body and transmits motion of the vibrating plate to the driven body, in which the fixed portion, the vibrator portion, and the contact portion are provided along an X direction in this order, when seen in a Y direction, when two directions parallel to a main surface of the vibrating plate and orthogonal to each other are set as the X direction and the Y direction and a direction orthogonal to the main surface of the vibrating plate is set as a Z direction.

In the piezoelectric driving device for a motor, it is possible to increase a force for pressing (pressing force) the vibrating plate to the driven body and to realize high output.

APPLICATION EXAMPLE 2

In the piezoelectric driving device for a motor according to Application Example 1, a terminal electrically connected to electrodes of the piezoelectric element may be provided in the fixed portion.

In the piezoelectric driving device for a motor, it is possible to decrease an effect of wirings connected to a terminal (specifically, wirings connected to a driving circuit for driving the piezoelectric driving device for a motor) applied on vibration of a vibrator main portion. In addition, it is possible to decrease a possibility of disconnection between wirings and terminals due to vibration of the vibrator main portion.

APPLICATION EXAMPLE 3

In the piezoelectric driving device for a motor according to Application Example 1 or 2, a plurality of piezoelectric elements may be provided in the vibrator portion so as to generate longitudinal vibration in the X direction and bending vibration in the Y direction.

In the piezoelectric driving device for a motor, it is possible to increase a force applied from the contact portion to the driven body, compared to a case where the longitudinal vibration is not generated in the vibrator portion in the X direction, for example.

APPLICATION EXAMPLE 4

In the piezoelectric driving device for a motor according to any one of Application Examples 1 to 3, the plurality of vibrating plates may be stacked in the Z direction.

In the piezoelectric driving device for a motor, it is possible to realize higher output.

APPLICATION EXAMPLE 5

In the piezoelectric driving device for a motor according to any one of Application Examples 1 to 4, the vibrating plate may be formed of a silicon substrate.

In the piezoelectric driving device for a motor, the vibrating plate can be processed by using a semiconductor manufacturing process (for example, a photolithography and an etching technology).

APPLICATION EXAMPLE 6

According to another aspect of the invention, there is provided a piezoelectric driving device for a motor, including: a vibrating plate including a base portion, a vibrator portion in which a piezoelectric element is provided, and a connection portion which connects the base portion and the vibrator portion to each other; and a contact portion which comes into contact with a driven body and transmits motion of the vibrating plate to the driven body, in which the base portion, the connection portion, and the vibrator portion are provided along an X direction in this order, when seen in a Y direction, when two directions parallel to a main surface of the vibrating plate and orthogonal to each other are set as the X direction and the Y direction, a direction orthogonal to the main surface of the vibrating plate is set as a Z direction, and a surface including the Y direction and the Z direction is set as a YZ plane, and an area of a cross section of the connection portion parallel to the YZ plane is smaller than an area of a cross section of the base portion parallel to the YZ plane.

In the piezoelectric driving device for a motor, a difference between a resonance frequency of longitudinal vibration and a resonance frequency of bending vibration hardly increases, even when a position of a vibrating plate with respect to a fixation member varies, compared to a case where the area of the cross section of the connection portion parallel to the YZ plane is the same as the area of the cross section of the base portion parallel to the YZ plane (for details, see experiment examples which will be described later).

APPLICATION EXAMPLE 7

In the piezoelectric driving device for a motor according to Application Example 6, the area of the cross section of the connection portion parallel to the YZ plane may be smaller than an area of a cross section of the vibrator portion parallel to the YZ plane.

In the piezoelectric driving device for a motor, a difference between a resonance frequency of longitudinal vibration and a resonance frequency of bending vibration hardly increases, even when a position of a vibrating plate with respect to a fixation member varies.

APPLICATION EXAMPLE 8

In the piezoelectric driving device for a motor according to Application Example 6 or 7, a size of the connection portion in the Y direction may be smaller than a size of the base portion and the vibrator portion in the Y direction.

In the piezoelectric driving device for a motor, it is possible to decrease the area of the cross section of the connection portion parallel to the YZ plane to be smaller than the area of the cross section of the base portion and the vibrator portion parallel to the YZ plane.

APPLICATION EXAMPLE 9

In the piezoelectric driving device for a motor according to any one of Application Examples 6 to 8, the piezoelectric driving device for a motor further includes a fixation member to which the base portion of the vibrating plate is attached, in which the connection portion may be provided in a positive X direction with respect to the edge of the fixation member in the positive X direction, when a direction from the base portion towards the vibrator portion side is set as the positive X direction.

In the piezoelectric driving device for a motor, it is possible to decrease a possibility that the connection portion is fixed to the fixation member, even when a position of the vibrating plate with respect to the fixation member varies.

APPLICATION EXAMPLE 10

In the piezoelectric driving device for a motor according to any one of Application Examples 6 to 9, a plurality of piezoelectric elements may be provided in the vibrator portion so as to generate longitudinal vibration in the X direction and bending vibration in the Y direction.

In the piezoelectric driving device for a motor, it is possible to increase a force applied from the contact portion to the driven body, compared to a case where the longitudinal vibration is not generated in the vibrator portion in the X direction, for example.

APPLICATION EXAMPLE 11

In the piezoelectric driving device for a motor according to any one of Application Examples 6 to 10, the base portion, the connection portion, the vibrator portion, and the contact portion are provided along the X direction in this order, when seen in the Y direction.

In the piezoelectric driving device for a motor, it is possible to increase a force for pressing the vibrating plate against the driven body and to realize high output.

APPLICATION EXAMPLE 12

According to still another aspect of the invention, there is provided a motor including: the piezoelectric driving device for a motor according to any one of Application Examples 1 to 11; and a rotor which is rotated by the piezoelectric driving device for a motor.

Such a motor can include the piezoelectric driving device for a motor according to the invention.

APPLICATION EXAMPLE 13

According to still another aspect of the invention, there is provided a robot including: a plurality of linking portions; a joint which connects the plurality of linking portions to each other; and the piezoelectric driving device for a motor according to any one of Application Examples 1 to 11 which rotates the plurality of linking portions by using the joint.

Such a robot can include the piezoelectric driving device for a motor according to the invention.

APPLICATION EXAMPLE 14

According to still another aspect of the invention, there is provided a pump including: the piezoelectric driving device for a motor according to any one of Application Examples 1 to 11; a tube which transports liquid; and a plurality of fingers which close the tube by driving the piezoelectric driving device for a motor.

Such a pump can include the piezoelectric driving device for a motor according to the invention.

BRIEF DESCRIPTION OF THE DRAWINGS

The invention will be described with reference to the accompanying drawings, wherein like numbers reference like elements.

FIG. 21 is a table showing a difference between a resonance frequency in longitudinal vibration and a resonance frequency in bending vibration.

FIG. 22 is a table showing a rate of change in a difference between a resonance frequency in longitudinal vibration and a resonance frequency in bending vibration.

FIG. 26 is a table showing a rate of change in a difference between a resonance frequency in longitudinal vibration and a resonance frequency in bending vibration.

DESCRIPTION OF EXEMPLARY EMBODIMENTS

Hereinafter, preferred embodiments of the invention will be described in detail with reference to the drawings. The embodiments described hereinafter do not unsuitably limit the content of the invention disclosed in the aspect. All of the constituent elements described hereinafter are not necessarily compulsory constituent elements of the invention.

1. First Embodiment 1.1. Piezoelectric Driving Device for Motor

Figure 1:
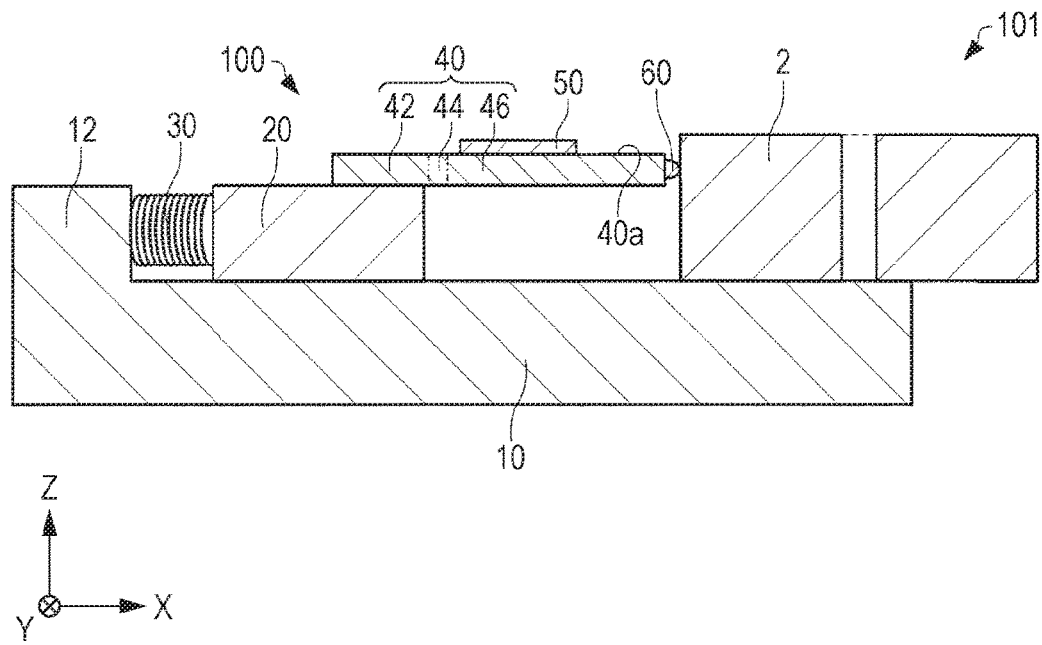
FIG. 1 is a sectional view schematically showing a piezoelectric driving device for a motor according to a first embodiment.
Figure 2:
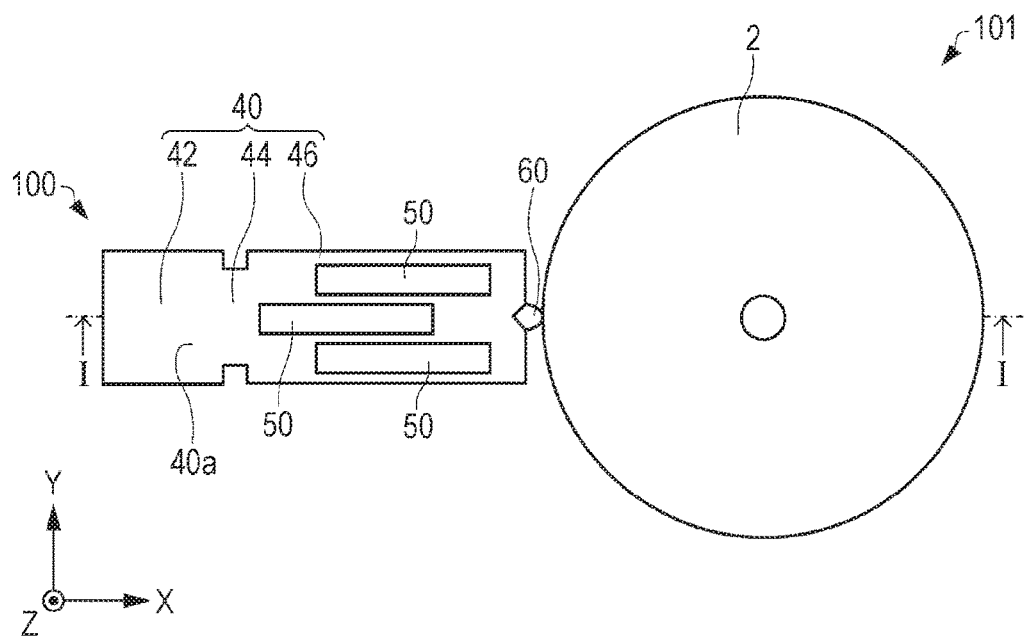
FIG. 2 is a plan view schematically showing the piezoelectric driving device for a motor according to the first embodiment.

First, a piezoelectric driving device for a motor according to a first embodiment will be described with reference to the drawings. FIG. 1 is a sectional view schematically showing a piezoelectric driving device for a motor 100 according to the first embodiment. FIG. 2 is a plan view schematically showing the piezoelectric driving device for a motor 100 according to the first embodiment. FIG. 1 is a sectional view taken along a line I-I of FIG. 2. FIGS. 1, 2, and 3 to 8 and 10 which will be described later show an X axis, a Y axis, and a Z axis orthogonal to each other.

As shown in FIG. 1 and FIG. 2, the piezoelectric driving device for a motor 100 includes a substrate 10, a fixed plate 20, a spring 30, a vibrating plate 40, a piezoelectric element 50, and a contact portion (protrusion) 60. The piezoelectric driving device for a motor 100 and a rotor (driven body) 2 configure a motor 101. The rotor 2 is rotated by the piezoelectric driving device for a motor 100. For convenience, in FIG. 2, the substrate 10, the fixed plate 20, and the spring 30 are not shown and the piezoelectric element 50 is shown in a simplified state.

As shown in FIG. 1, the fixed plate 20 and the rotor 2 are mounted on the substrate 10. In the example shown in the drawing, the substrate 10 includes a protrusion which is protruded to a side in the positive Z axis direction. A material of the substrate 10 is not particularly limited and is, for example, a metal material, a resin material, a ceramic material, or a semiconductor material.

The fixed plate (fixation member) 20 is provided on the substrate 10. A fixed portion 42 of the vibrating plate 40 is fixed to the fixed plate 20. The fixed plate 20 can be displaced with respect to the substrate 10 (displaced in an X axis direction in the example shown in the drawing). A material of the fixed plate 20 is, for example, stainless steel.

The spring 30 connects a protrusion 12 of the substrate 10 and the fixed plate 20 to each other. In the example shown in the drawing, the spring 30 urges the fixed plate 20 to the positive X axis direction side. Accordingly, the contact portion 60 can be pressurized (pressed) against the rotor 2.

The vibrating plate 40 is provided on the fixed plate 20. The vibrating plate 40 is, for example, formed of a semiconductor substrate (specifically, a silicon substrate). A material of the vibrating plate 40 may be, for example, a metal material such as stainless steel, aluminum, an aluminum alloy, titanium, a titanium alloy, copper, a copper alloy, or an iron-nickel alloy, or a ceramic material such as alumina or zirconia. In the example shown in the drawing, the vibrating plate 40 has a shape having the X axis direction as a longitudinal direction. The vibrating plate 40 includes a fixed portion 42, a connection portion 44, and a vibrator portion 46.

The fixed portion 42 is fixed to the fixed plate 20. The fixed portion 42 is a portion of the vibrating plate 40 which is overlapped on the fixed plate 20, when seen in the Z axis direction (in a plan view). The fixed portion 42 may be, for example, connected to the fixed plate 20 via an adhesive (not shown). As shown in FIG. 1, the vibrating plate 40 is supported by the fixed plate 20 in a cantilever form.

The connection portion 44 connects the fixed portion 42 and the vibrator portion 46. The connection portion 44 is provided to be separated from the fixed plate 20. In the example shown in the drawing, a size (width) of the connection portion 44 in the Y axis direction may be smaller than a width of the fixed portion 42 and a width of the vibrator portion 46. Although not shown, the width of the connection portion 44 may be the same as the width of the fixed portion 42 and the connection portion 44 may include a portion having the same width as that of the fixed portion 42 and a portion having a smaller width than that of the fixed portion 42. In addition, the connection portion may not be provided and the fixed portion 42 and the vibrator portion 46 may be connected to each other.

The vibrator portion 46 is supported by the fixed portion 42 through the connection portion 44. The vibrator portion 46 is provided to be separated from the fixed plate 20. The piezoelectric element 50 is provided on the vibrator portion 46. In the example shown in the drawing, a size of the vibrator portion 46 in the Y axis direction is the same as the size of the fixed portion 42 in the Y axis direction. The vibrator portion 46 can be deformed in accordance with deformation of the piezoelectric element 50. A thickness of the vibrator portion 46 is, for example, equal to or smaller than 700 μm. Accordingly, the vibrator portion 46 can be sufficiently deformed in accordance with deformation of the piezoelectric element 50.

Figure 3:
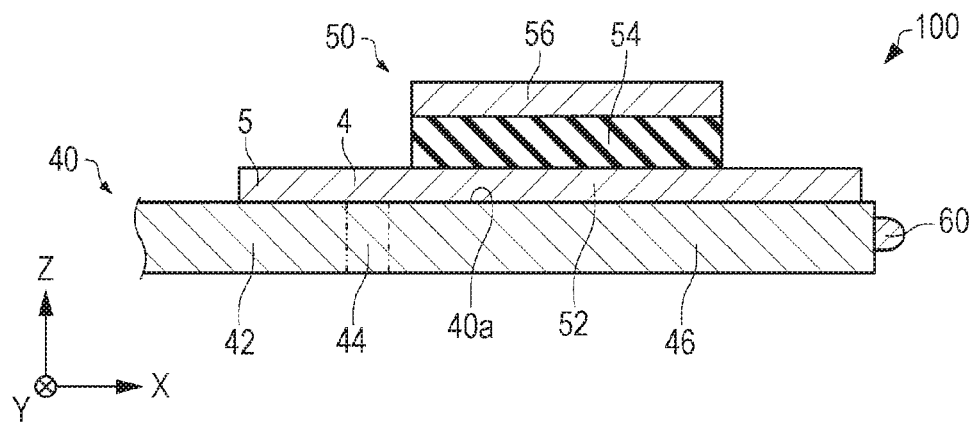
FIG. 3 is a sectional view schematically showing the piezoelectric driving device for a motor according to the first embodiment.
Figure 4:
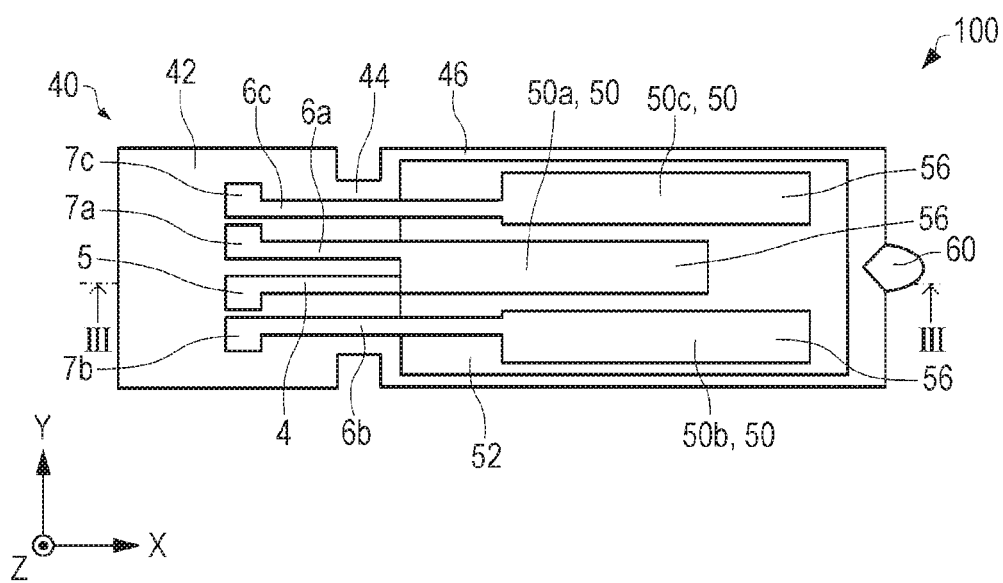
FIG. 4 is a plan view schematically showing the piezoelectric driving device for a motor according to the first embodiment.

The piezoelectric element 50 is provided on the vibrator portion 46. In the example shown in the drawing, the piezoelectric element 50 is provided on a main surface 40a of the vibrating plate 40. The main surface 40a is a surface parallel to the X direction (X axis direction) and the Y direction (Y axis direction) (surface parallel to the XY plane) and is a surface orthogonal to the Z direction (Z axis direction) (surface having a vertical line in the Z axis direction). In the example shown in the drawing, the main surface 40a is a surface facing the positive Z axis direction. Herein, FIG. 3 is a sectional view schematically showing the piezoelectric driving device for a motor 100. FIG. 4 is a plan view schematically showing the piezoelectric driving device for a motor 100. FIG. 3 is a sectional view taken along a line III-III of FIG. 4. For convenience, in FIG. 3 and FIG. 4, the substrate 10, the fixed plate 20, and the spring 30 are not shown.

As shown in FIG. 4, the plurality of piezoelectric elements 50 are provided. In the example shown in FIG. 4, three piezoelectric elements 50 are provided. A piezoelectric element 50a is provided between a piezoelectric element 50b and a piezoelectric element 50c. The piezoelectric element 50b is provided on the negative Y axis direction side with respect to the piezoelectric element 50a. The piezoelectric element 50c is provided on the positive Y axis direction side with respect to the piezoelectric element 50a. As shown in FIG. 3, the piezoelectric element 50 includes a first electrode layer 52, a piezoelectric layer 54, and a second electrode layer 56.

The first electrode layer 52 is provided on the vibrator portion 46. The first electrode layer 52 may be configured with an iridium layer provided on the vibrator portion 46 and a platinum layer provided on the iridium layer. A thickness of the iridium layer is, for example, from 5 nm to 100 nm. A thickness of the platinum layer is, for example, from 50 nm to 300 nm. The first electrode layer 52 may be a metal layer formed of Ti, Pt, Ta, Ir, Sr, In, Sn, Au, Al, Fe, Cr, Ni, or Cu or a layer obtained by mixing or stacking two or more kinds thereof.

The first electrode layer 52 is an electrode for applying a voltage to the piezoelectric layer 54. In the example shown in the drawing, the first electrode layer 52 of the three piezoelectric elements 50a, 50b, and 50c is provided as one electrode layer connected to each piezoelectric element (is configured as a common electrode layer).

As shown in FIG. 4, the first electrode layer 52 is electrically connected to a terminal 5 via a wiring 4. In the example shown in the drawing, a size of the terminal 5 in the Y axis direction is greater than a size of the wiring 4 in the Y axis direction. The terminal 5 is provided on the fixed portion 42. The terminal 5 may be grounded. For convenience, in FIG. 1 and FIG. 2, the wiring 4 and the terminal 5 are not shown.

The piezoelectric layer 54 is provided on the first electrode layer 52. A thickness of the piezoelectric layer is, for example, from 0.05 μm to 20 μm and preferably from 1 μm to 7 μm. As described above, the piezoelectric element 50 is a thin-film piezoelectric element. When the thickness of the piezoelectric layer 54 is smaller than 0.05 μm, the output of the piezoelectric driving device for a motor 100 may be decreased. Specifically, when a voltage applied to the piezoelectric layer 54 is increased in order to increase the output, insulation breakdown of the piezoelectric layer 54 may occur. When the thickness of the piezoelectric layer 54 is greater than 20 μm, cracks may be generated on the piezoelectric layer 54. When the thickness of the piezoelectric layer 54 is greater than 20 μm, the mass of the piezoelectric element 50 increases and the vibrating plate 40 may not have a cantilever structure. In the example shown in the drawing, the piezoelectric layer 54 of the three piezoelectric element 50a, 50b, and 50c are provided to be separated from each other.

A piezoelectric material such as perovskite type oxide is used as the piezoelectric layer 54. Specific examples of the material of the piezoelectric layer 54 include lead zirconate titanate (Pb(Zr,Ti)O$_3$: PZT) and lead zirconate titanate niobate (Pb(Zr,Ti,Nb)O$_3$: PZTN).

The second electrode layer 56 is provided on the piezoelectric layer 54. The second electrode layer 56 may be configured with an adhesive layer provided on the piezoelectric layer 54 and a conductive layer provided on the adhesive layer. A thickness of the adhesive layer is, for example, from 10 nm to 100 nm. The adhesive layer is, for example, a TiW layer, a Ti layer, a Cr layer, a NiCr layer or a laminate thereof. A thickness of the conductive layer is, for example, from 1 μm to 10 μm. The conductive layer is, for example, a Cu layer, an Au layer, an Al layer or a laminate thereof.

The second electrode layer 56 is the other electrode for applying a voltage to the piezoelectric layer 54. In the example shown in the drawing, the second electrode layer 56 of the three piezoelectric elements 50a, 50b, and 50c are provided to be separated from each other.

As shown in FIG. 4, the second electrode layer 56 is electrically connected to terminals 7a, 7b, and 7c via wirings 6a, 6b, and 6c. Specifically, the second electrode layer 56 of the piezoelectric element 50a is electrically connected to the terminal 7a, the second electrode layer 56 of the piezoelectric element 50b is electrically connected to the terminal 7b, and the second electrode layer 56 of the piezoelectric element 50c is electrically connected to the terminal 7c. In the example shown in the drawing, the size of the terminals 7a, 7b, and 7c in the Y axis direction is greater than the size of the wirings 6a, 6b, and 6c in the Y axis direction. The terminals 7a, 7b, and 7c are provided on the fixed portion 42. The wirings 6a, 6b, and 6c are provided so as not to come into contact with the wiring 4 and the first electrode layer 52. For convenience, in FIG. 1 and FIG. 2, the wirings 6a, 6b, and 6c and the terminals 7a, 7b, and 7c are not shown.

Although not shown, the first electrode layers 52 of the three piezoelectric elements 50a, 50b, and 50c may be provided to be separated from each other and the second electrode layers 56 of the three piezoelectric elements 50a, 50b, and 50c may be connected to each other and provided as one electrode layer. In addition, the piezoelectric layers 54 of the three piezoelectric elements 50a, 50b, and 50c may be connected to each other and provided as one piezoelectric layer. Further, the piezoelectric element 50 may also be provided on a lower surface facing a side opposite to the main surface (upper surface) 40a of the vibrator portion 46.

The contact portion 60 is provided on the edge (in the example shown in the drawing, the edge on the positive X axis direction side) of the vibrator portion 46. The contact portion 60 is a member which comes into contact with the rotor 2 and transmits motion (vibration) of the vibrating plate 40 to the rotor 2. The contact portion 60 may be provided as a separate member from the vibrating plate 40 or may be integrally provided with the vibrating plate 40. The contact portion 60 may be provided on the vibrating plate 40 via an adhesive (not shown). A material of the contact portion 60 may be, for example, ceramic (specifically, alumina (Al$_2$O$_3$), zirconia (ZrO$_2$), or silicon nitride (Si$_3$N)).

As shown in FIG. 1, the fixed portion 42, the connection portion 44, the vibrator portion 46, and the contact portion 60 are provided along the X axis direction in this order, when seen in the Y axis direction. When seen in the Y axis direction, the fixed portion 42, the connection portion 44, the vibrator portion 46, and the contact portion 60 are provided along a virtual straight line (not shown) parallel to the X axis, in this order. In the example shown in the drawing, the fixed portion 42, the connection portion 44, the vibrator portion 46, the contact portion 60, and the rotor 2 are provided along the X axis direction in this order.

Figure 5:
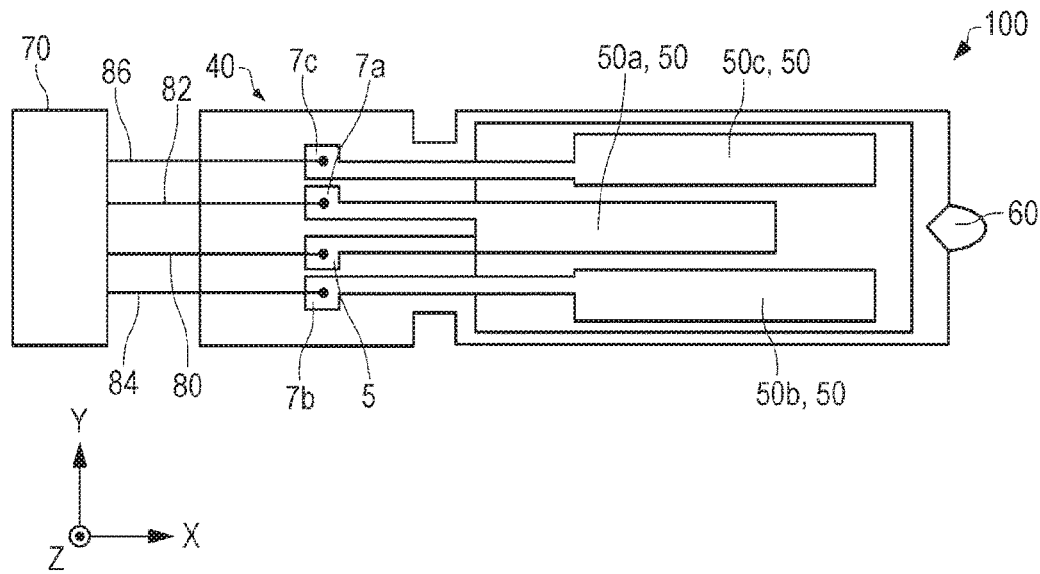
FIG. 5 is a diagram for illustrating a state where the piezoelectric driving device for a motor according to the first embodiment and a driving circuit are electrically connected to each other.

Herein, FIG. 5 is a diagram for illustrating a state where the piezoelectric driving device for a motor 100 and a driving circuit 70 are electrically connected to each other. As shown in FIG. 5, the terminals 5, 7a, 7b, and 7c are electrically connected to the driving circuit 70 via wirings 80, 82, 84, and 86, respectively.

The driving circuit 70 can cause ultrasonic vibration of the piezoelectric driving device for a motor 100 to rotate the rotor 2 coming into contact with the contact portion 60 in a predetermined rotation direction, by applying an AC voltage or an undulating voltage which periodically changes, between the terminal 5 and the terminal 7a and between the terminal 5 and the terminal 7b. Herein, the "undulating voltage" means a voltage obtained by applying DC offset to an AC voltage and a direction of the voltage (electric field) is a direction from one electrode towards the other electrode. In addition, the driving circuit 70 can rotate the rotor 2 coming into contact with the contact portion 60 by applying an AC voltage or an undulating voltage between the terminal 5 and the terminal 7c and between the terminal 5 and the terminal 7a.

Figure 6:
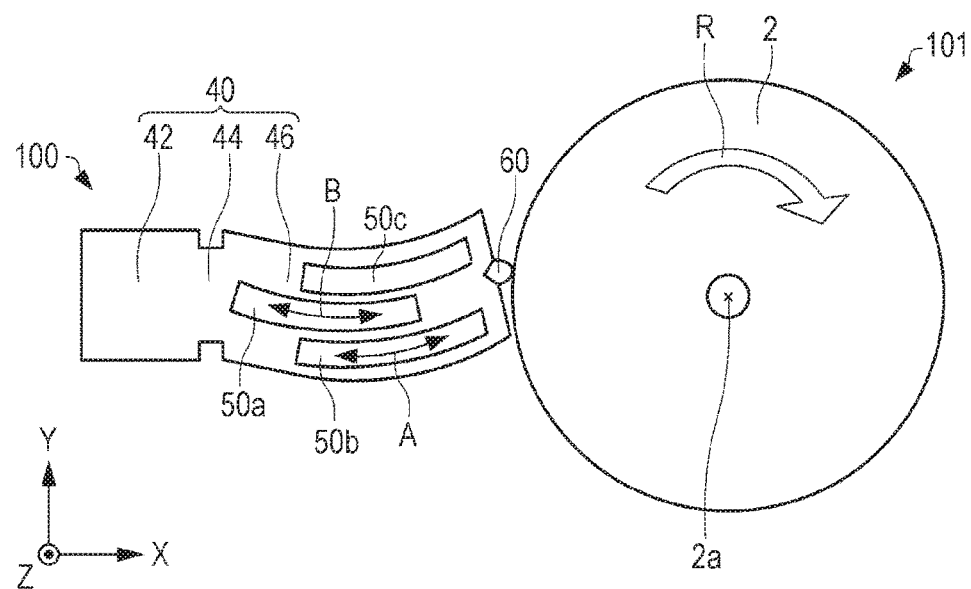
FIG. 6 is a diagram for illustrating an operation of the piezoelectric driving device for a motor according to the first embodiment.

FIG. 6 is a diagram for illustrating an operation of the piezoelectric driving device for a motor 100. As shown in FIG. 6, the contact portion 60 of the piezoelectric driving device for a motor 100 comes into contact with an outer periphery of the rotor 2. The driving circuit 70 applies an AC voltage or an undulating voltage between the terminal 5 and the terminal 7b. Accordingly, the piezoelectric layer 54 of the piezoelectric element 50b expands and contracts in an arrow A direction of FIG. 6. With respect to this, the vibrator portion 46 performs bending vibration in the Y axis direction (inplane parallel to the XY plane). The driving circuit 70 applies an AC voltage or an undulating voltage between the terminal 5 and the terminal 7a. Accordingly, the piezoelectric layer 54 of the piezoelectric element 50c expands and contracts in an arrow B direction of FIG. 6. With respect to this, the vibrator portion 46 performs longitudinal vibration (expansion and contraction) in the X axis direction. Due to the bending vibration and the longitudinal vibration of the vibrator portion 46, the contact portion 60 performs elliptic motion and the rotor 2 rotates in a direction R (in FIG. 6, clockwise) using a center 2a as an axis.

In a case where the driving circuit 70 applies an AC voltage or an undulating voltage between the terminal 5 and the terminal 7c and between the terminal 5 and the terminal 7a, the rotor 2 rotates in a direction (counterclockwise) opposite to the direction R.

As described above, the plurality of piezoelectric elements 50 are provided in the vibrator portion 46 so as to cause generation of longitudinal vibration in the X axis direction and the bending vibration in the Y axis direction. Specifically, the piezoelectric element 50a is a piezoelectric element for generating longitudinal vibration in the vibrating plate 40 in the X axis direction and the piezoelectric elements 50b and 50c are piezoelectric elements for generating bending vibration in the vibrating plate 40 in the Y axis direction.

The piezoelectric driving device for a motor 100 has, for example, the following characteristics.

In the piezoelectric driving device for a motor 100, the fixed portion 42, the connection portion 44, the vibrator portion 46, and the contact portion 60 are provided along the X axis direction in this order, when seen in the Y axis direction. Accordingly, in the piezoelectric driving device for a motor 100, it is possible to increase a force for pressing the vibrating plate 40 to the rotor 2 and to realize high output. In addition, the piezoelectric driving device for a motor 100 is hardly damaged from external impacts, for example, and can have high reliability.

For example, in a case where a rotor is disposed so as to come into contact with a main surface of a vibrating plate (in a case where a contact portion is provided on a main surface of a vibrating plate), the vibrating plate is pressed in a vertical direction of the main surface of the vibrating plate, and accordingly, the vibrating plate may be damaged due to concentration of stress to the boundary of the fixed portion and the connection portion of the vibrating plate, and a force for pressing the vibrating plate may not be increased (for details, see experiment examples which will be described later). In addition, the boundary of the fixed portion and the connection portion of the vibrating plate is easily damaged and reliability may be low.

For example, in a case where the center of the vibrating plate in a longitudinal direction is supported by using an arm portion which is an elongated member at two supporting points from both side (center supporting structure), the vibrating plate may be damaged due to concentration of stress (shear stress) to the boundary of the vibrating plate and the arm portion, and a force for pressing the vibrating plate may not be increased (for details, see experiment examples which will be described later). In addition, the boundary of the vibrating plate and the arm portion is easily damaged and reliability may be low.

In the piezoelectric driving device for a motor 100, since the vibrating plate 40 has a cantilever structure, it is possible to increase a width (size in the Y axis direction) of the wirings 4, 6a, 6b, and 6c which electrically connects the terminals 5, 7a, 7b, and 7c and the piezoelectric element 50, compared to a case of the center supporting structure in which the vibrating plate is supported by using the arm portion which is an elongated member, for example. Accordingly, it is possible to decrease resistance regarding the wirings 4, 6a, 6b, and 6c and it is possible to efficiently apply a voltage to the piezoelectric element 50. In addition, it is possible to prevent heat generation of the wirings 4, 6a, 6b, and 6c.

In the piezoelectric driving device for a motor 100, it is possible to realize high output, even when the size of the vibrating plate 40 in the X axis direction is decreased, compared to a case of the center supporting structure, for example. That is, in the piezoelectric driving device for a motor 100, it is possible to realize high output while realizing miniaturization, compared to a case of the center supporting structure. Therefore, it is possible to increase the number of vibrating plates 40 in one silicon wafer, for example. In addition, it is possible to decrease the volume of the vibrating plate 40.

In the piezoelectric driving device for a motor 100, the terminals 5, 7a, 7b, and 7c electrically connected to the electrode layers 52 and 56 of the piezoelectric element 50 are provided in the fixed portion 42. Therefore, it is possible to decrease an effect of the wirings 80, 82, 84, and 86 applied on vibration of the vibrator portion 46. In addition, it is possible to decrease a possibility of disconnection between the terminals 5, 7a, 7b, and 7c and the wirings 80, 82, 84, and 86 due to vibration of the vibrator portion 46.

In the piezoelectric driving device for a motor 100, the plurality of piezoelectric elements 50 are provided in the vibrator portion 46 so as to cause generation of longitudinal vibration in the X axis direction and the bending vibration in the Y axis direction. Therefore, in the piezoelectric driving device for a motor 100, it is possible to increase a force for applied from the contact portion 60 to the rotor 2, compared to a case where the longitudinal vibration of the vibrator portion in the X axis direction is not generated, for example.

In the piezoelectric driving device for a motor 100, the vibrating plate 40 is formed of a silicon substrate. Therefore, in the piezoelectric driving device for a motor 100, the vibrating plate 40 can be processed by using a semiconductor manufacturing process (for example, a photolithography and an etching technology).

1.2. Manufacturing Method of Piezoelectric Driving Device for Motor

Next, a manufacturing method of the piezoelectric driving device for a motor 100 according to the first embodiment will be described with reference to the drawings.

As shown in FIG. 2, the vibrating plate 40 is formed. The vibrating plate 40 is, for example, formed by patterning a silicon wafer (not shown) by using photolithography and etching.

As shown in FIG. 3, the first electrode layer 52, the piezoelectric layer 54, and the second electrode layer are formed in this order on the vibrator portion 46 of the vibrating plate 40. The electrode layers 52 and 56 are, for example, formed by forming a conductive layer by a sputtering method, a chemical vapor deposition (CVD) method, and a plating method, and patterning the conductive layer by photolithography and etching. The piezoelectric layer 54 is, for example, formed by forming an insulating layer by a sol-gel method and a metal organic deposition (MOD) method and patterning the insulating layer by photolithography and etching. By performing this step, the piezoelectric element 50 can be formed.

In a step of forming the first electrode layer 52, the wiring 4 and the terminal 5 can be formed. In a step of forming the second electrode layer 56, the wirings 6a, 6b, and 6c and the terminals 7a, 7b, and 7c can be formed.

Next, the contact portion 60 is connected to the vibrator portion 46. The connection between the contact portion 60 and the vibrator portion 46 is performed by using an adhesive layer, for example.

Next, the vibrating plate 40 where the piezoelectric element 50 and the contact portion 60 are provided is fixed to the fixed plate 20. The connection between the fixed plate 20 and the vibrating plate 40 is performed by using an adhesive layer, for example.

By performing the above-mentioned steps, the piezoelectric driving device for a motor 100 can be manufactured.

Next, the terminals 5, 7a, 7b, and 7c of the piezoelectric driving device for a motor 100 are connected to the driving circuit 70 through the wirings 80, 82, 84, and 86, respectively.

1.3. Experiment Examples

Hereinafter, experiment examples are shown and the invention will be described in more detail. The invention is not limited to the following experiment examples.

1.3.1 Models Used in Simulation

Figure 7:
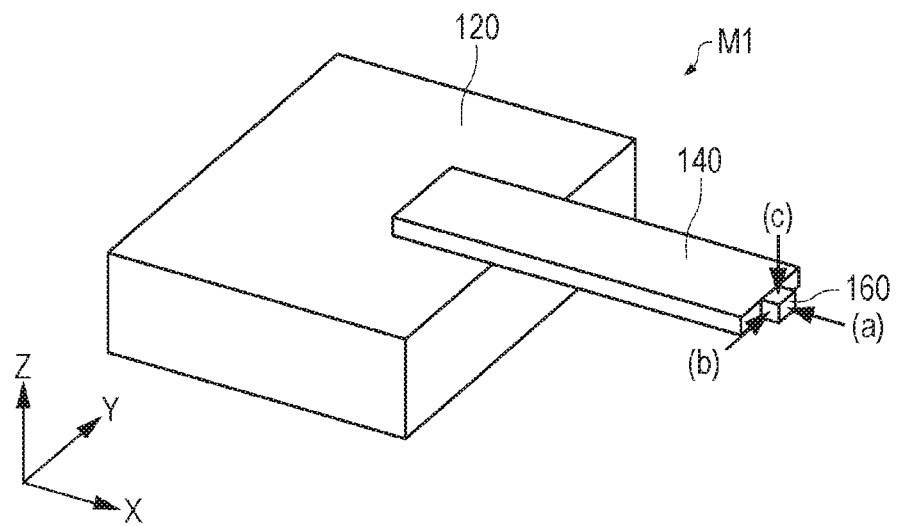
FIG. 7 is a diagram for illustrating a model used in a simulation.

A simulation was performed by a finite element method by using models M1 and M2. FIG. 7 is a diagram for illustrating the model M1 used in a simulation and FIG. 8 is a diagram for illustrating the model M2 used in a simulation.

As shown in FIG. 7, in the model M1, the vibrating plate 140 is supported in a cantilever form (cantilever structure). An edge of a vibrating plate 140 on the negative X axis direction side is fixed to a fixed plate 120. The shape of the vibrating plate 140 is a rectangle. A protrusion 160 is provided on an edge of the vibrating plate 140 on the positive X axis direction side. A length (size in the X axis direction) of the vibrating plate 140 which is not fixed to the fixed plate 120 is 2.5 mm. A width (size in the Y axis direction) of the vibrating plate 140 is 1 mm. A length of the protrusion 160 is 0.2 mm. A width of the protrusion 160 is 0.4 mm. A thickness of the vibrating plate 140 and the protrusion 160 is 0.2 mm. A material of the vibrating plate 140 and the protrusion 160 is silicon.

Figure 8:
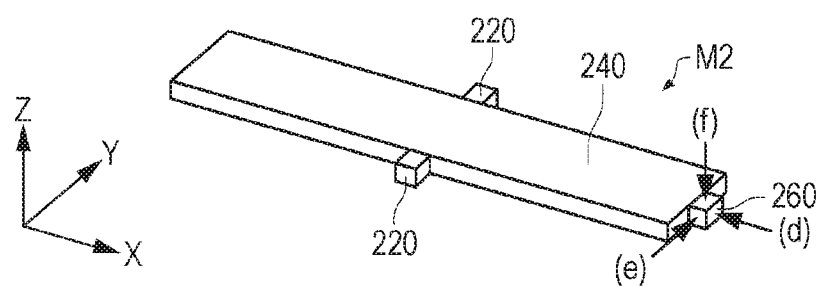
FIG. 8 is a diagram for illustrating a model used in a simulation.

As shown in FIG. 8, in the model M2, the center of a vibrating plate 240 in the X axis direction is supported by supports 220 from the Y axis direction side (center supporting structure). The shape of the vibrating plate 240 is a rectangle. A protrusion 260 is provided on an edge of the vibrating plate 240 on the positive X axis direction side. A length of the vibrating plate 240 is 5 mm. A width of the vibrating plate 240 is 1 mm. A length and a width of the support 220 is 0.2 mm. A length and a width of the protrusion 260 are respectively the same as the length and the width of the protrusion 160. A thickness of the supports 220, the vibrating plate 240, and the protrusion 260 is 0.2 mm. A material of the supports 220, the vibrating plate 240, and the protrusion 260 is silicon.

1.3.2 Simulation Results

Figures 9, 10:
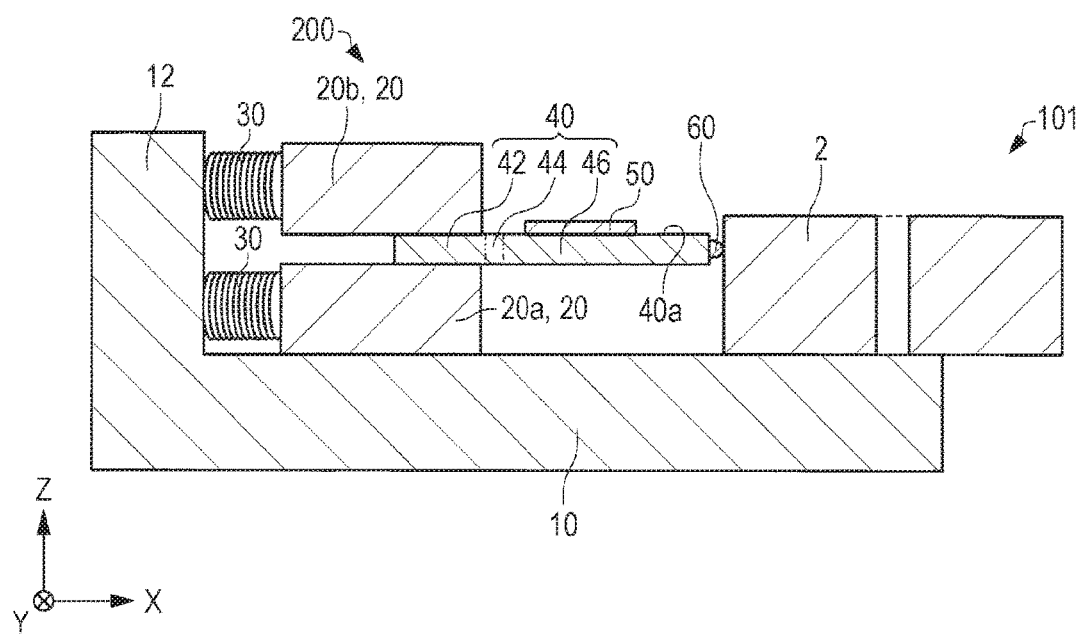
FIG. 9 is a table showing the maximum stress generated in vibrating plates.
FIG. 10 is a sectional view schematically showing a piezoelectric driving device for a motor according to a modification example of the first embodiment.

In the models M1 and M2 described above, maximum stress generated in the vibrating plates 140 and 240 was calculated by adding (pressing) a force of 1.0 N to the protrusions 160 and 260. The directions of a force applied to the protrusion 160 (pressing direction) were set as (a) negative X axis direction, (b) positive Y axis direction, and (c) negative Z axis direction, and the directions of a force applied to the protrusion 260 were set as (d) negative X axis direction, (e) positive Y axis direction, and (f) negative Z axis direction. FIG. 9 is a table showing maximum stress generated in the vibrating plates 140 and 240.

In FIG. 9, it was found that, in the cantilever structure of the model M1, the maximum stress generated in a vibrating plate is small in a case where a force is applied in the (a) negative X axis direction, compared to a case where a force is applied in the (b) positive Y axis direction and the (c) negative Z axis direction. Accordingly, it was found that a possibility of damage on a vibrating plate is low, even when a great force is applied, in a case of (a), compared to the case of (b) or (c).

In FIG. 9, it was found that, in a case where a force is applied in the negative X axis direction, the maximum stress generated in a vibrating plate is small, in the case of a cantilever structure of the (a) model M1, compared to a case of the center supporting structure of (d) model M2. Accordingly, it was found that a possibility of damage on a vibrating plate is low, even when a great force is applied, in a case of (a), compared to a case of (d).

Herein, the output of a motor is proportional to the sum of a generating force and a rotation rate of a rotor. Since a piezoelectric driving device for a motor transmits vibration of a vibrating plate to a rotor by using a frictional force, a generating force is proportional to a force F for pressing a protrusion against a rotor. Specifically, the generating force is represented as the sum of the force F and a coefficient of friction μ between a protrusion and a rotor. Accordingly, in order to obtain high output, it is necessary to apply a great force to a protrusion (to a vibrating plate).

As described above, in a case of (a) of FIG. 9, the maximum stress generated in a vibrating plate is small and a possibility of damage on a vibrating plate is low, even when a great force is applied to a protrusion, compared to the cases of (b) to (f). Accordingly, in a case of (a) of FIG. 9, it is possible to realize high output. Therefore, in the piezoelectric driving device for a motor 100 in which the fixed portion 42, the connection portion 44, the vibrator portion 46, and the contact portion 60 are provided along the X axis direction in this order, it is possible to realize high output.

1.4. Modification Examples of Piezoelectric Driving Device for Motor

Next, a piezoelectric driving device for a motor according to a modification example of the first embodiment will be described with reference to the drawings. FIG. 10 is a sectional view schematically showing a piezoelectric driving device for a motor 200 according to a modification example of the first embodiment. For convenience, in FIG. 10, the piezoelectric element 50 is simplified and the wirings 4, 6a, 6b, and 6c and the terminals 5, 7a, 7b, and 7c are not shown.

Hereinafter, in the piezoelectric driving device for a motor 200 according to a modification example of the first embodiment, the same reference numerals are used for members having the same functions as constituent elements of the piezoelectric driving device for a motor 100 according to the first embodiment and the specific description thereof will be omitted.

As shown in FIG. 1, in the piezoelectric driving device for a motor 100 described above, one fixed plate 20 was provided. With respect to this, as shown in FIG. 10, in the piezoelectric driving device for a motor 200, two fixed plates 20 are provided. The two fixed plates 20 are provided so as to interpose the fixed portion 42 of the vibrating plate 40 in the Z axis direction.

In the example shown in the drawing, a fixed plate 20a is provided on the negative Z axis direction side of the fixed portion 42 and a fixed plate 20b is provided on the positive Z axis direction side of the fixed portion 42. For example, a plurality of wirings (not shown) are provided on a lower surface (surface facing the negative Z axis direction) of the fixed plate 20b and the plurality of wirings may be, respectively, connected to the terminals 5, 7a, 7b, and 7c. The plurality of wirings may approach the upper surface of the fixed plate 20b through a penetration hole (not shown) provided in the fixed plate 20b and may be connected to the wirings 80, 82, 84, and 86, respectively.

In the piezoelectric driving device for a motor 200, the two fixed plates 20 are provided so as to interpose the fixed portion 42 of the vibrating plate 40 in the Z axis direction. Accordingly, in the piezoelectric driving device for a motor 200, since a degree of deformation of the fixed plate 20 is decreased and the contact portion 60 is greatly vibrate, compared to the piezoelectric driving device for a motor 100, it is possible to more efficiently rotate a rotor.

Although not shown, in the piezoelectric driving device for a motor according to the invention, a side surface (edge surface) of a vibrating plate facing the negative X axis direction may be fixed (connected) to a fixed plate.

2. Second Embodiment

2.1. Piezoelectric Driving Device for Motor

Figure 11:
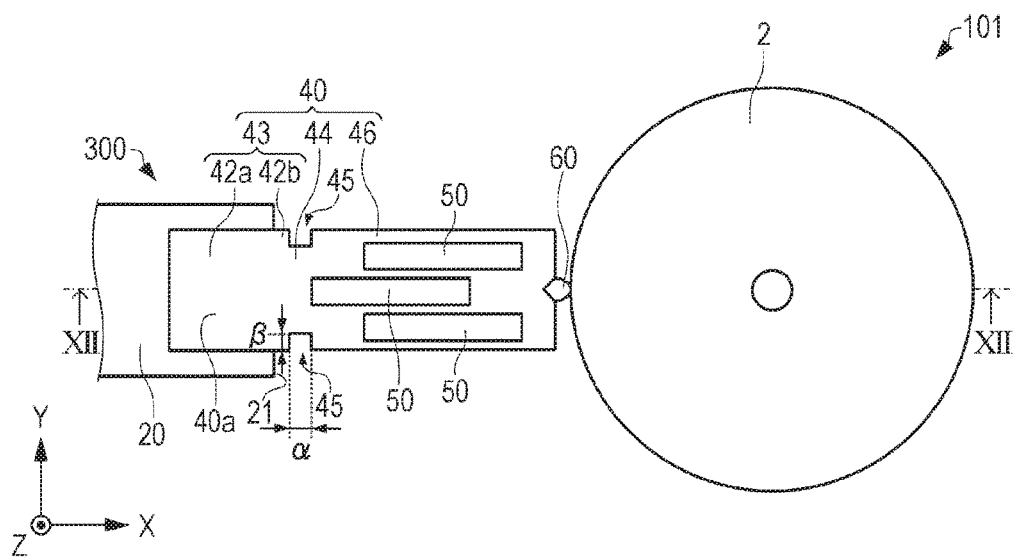
FIG. 11 is a plan view schematically showing a piezoelectric driving device for a motor according to a second embodiment.
Figure 12:
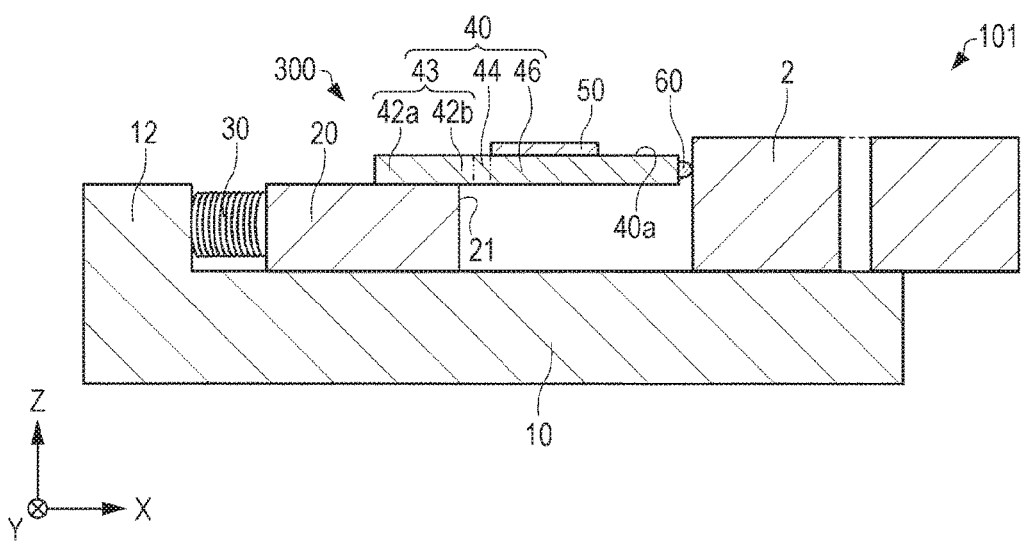
FIG. 12 is a sectional view schematically showing the piezoelectric driving device for a motor according to the second embodiment.

Next, a piezoelectric driving device for a motor according to a second embodiment will be described with reference to the drawings. FIG. 11 is a plan view schematically showing a piezoelectric driving device for a motor 300 according to the second embodiment. FIG. 12 is a sectional view taken along a line XII-XII of FIG. 11 schematically showing the piezoelectric driving device for a motor 300 according to the second embodiment. FIGS. 11 and 12, and FIGS. 13 to 18B, 23, and 31 which will be described later show an X axis, a Y axis, and a Z axis orthogonal to each other. For convenience, in FIG. 11, the substrate 10, the fixation member 20, and the spring 30 are not shown. In FIG. 11 and FIG. 12, the piezoelectric element 50 is simplified.

Hereinafter, in the piezoelectric driving device for a motor 300 according to the second embodiment, the same reference numerals are used for members having the same functions as constituent elements of the piezoelectric driving device for a motor 100 according to the first embodiment and the specific description thereof will be omitted.

As shown in FIG. 11 and FIG. 12, in the piezoelectric driving device for a motor 300, the vibrating plate 40 includes a base portion 43, the connection portion 44, and the vibrator portion 46.

The base portion 43 is provided on the fixation member 20. In the example shown in the drawing, a planar shape (shape when seen in the Z axis direction) of the base portion 43 is a rectangle. The base portion 43, for example, includes a first portion 42a overlapped on the fixation member 20 and a second portion 42b which is not overlapped on the fixation member 20, when seen in the Z axis direction (in a plan view). The first portion 42a is fixed to the fixation member 20. The first portion 42a may be, for example, connected to the fixation member 20 via an adhesive (not shown). The second portion 42b is connected to the first portion 42a. The second portion 42b may be deformed together with vibration (deformation) of the vibrator portion 46. As shown in FIG. 12, the vibrating plate 40 is supported by the fixation member 20 in a cantilever form. Although not shown, the base portion 43 may be configured only with the first portion 42a, without the second portion 42b.

The connection portion 44 connects the base portion 43 and the vibrator portion 46. The connection portion 44 is provided to be separated from the fixation member 20. The connection portion 44 is a portion of the vibrating plate 40 where the piezoelectric element 50 is not provided and a portion positioned between the base portion 43 and the vibrator portion 46. In the example shown in the drawing, a planar shape of the connection portion 44 is a rectangle.

An area of a cross section of the connection portion 44 parallel to the YZ plane is smaller than an area of a cross section of the base portion 43 parallel to the YZ plane and is smaller than an area of a cross section of the vibrator portion 46 parallel to the YZ plane. In the example shown in the drawing, a size of the connection portion 44 in the Y axis direction is smaller than a size of the base portion 43 in the Y axis direction and is smaller than a size of the vibrator portion 46 in the Y axis direction. The size of the connection portion 44 in the Y axis direction is, for example, from 0.1 mm to 16 mm and the size of the vibrator portion 46 in the Y axis direction is, for example, from 0.2 mm to 20 mm. A thickness (size in the Z axis direction) of the connection portion 44 is the same as a thickness of the base portion 43 and the vibrator portion 46. The thickness of the connection portion 44 is, for example, from 0.05 mm to 1 mm. The YZ plane is a surface (surface including the Y axis and the Z axis) including the Y direction (Y axis direction) and the Z direction (Z axis direction).

The connection portion 44 is provided on the positive X axis direction side with respect to an edge 21 of the fixation member 20 on the positive X direction (positive X axis direction (direction facing from the base portion 43 towards the vibrator portion 46 side)) side. That is, the connection portion 44 is not overlapped with the fixation member 20 in a plan view and the base portion 43 includes a second portion 42b which is not overlapped with the fixation member 20.

The connection portion 44 is, for example, formed by providing cut-out portions 45 in the vibrating plate 40. In the example shown in the drawing, two cut-out portions 45 are provided along the Y axis and penetrate through the vibrating plate 40 in the Z axis direction. A size α of the cut-out portion 45 in the X axis direction is, for example, from 0.05 mm to 5 mm and preferably from 0.1 mm to 0.5 mm. A size β of the cut-out portion 45 in the Y axis direction is, for example, from 0.05 mm to 5 mm and preferably from 0.1 mm to 0.5 mm. The connection portion 44 may be deformed together with deformation of the vibrator portion 46.

The vibrator portion 46 is supported by the base portion 43 via the connection portion 44. The vibrator portion 46 is provided to be separated from the fixation member 20. The piezoelectric element 50 is provided in the vibrator portion 46. In the example shown in the drawing, the vibrator portion 46 is a portion of the vibrating plate positioned on the positive X axis direction side with respect to the connection portion 44. A planar shape of the vibrator portion 46 is, for example, approximately rectangle. In the example shown in the drawing, the size of the vibrator portion 46 in the Y axis direction is the same as the size of the base portion 43 in the Y axis direction. The vibrator portion 46 can be deformed in accordance with the deformation of the piezoelectric element 50. The thickness of the vibrator portion 46 is, for example, equal to or smaller than 700 μm. Therefore, the vibrator portion can be sufficiently deformed in accordance with the deformation of the piezoelectric element 50.

The terminals 7a, 7b, and 7c are provided on the base portion 43. The wirings 4, 6a, 6b, and 6c pass through the upper portion of the connection portion 44.

As shown in FIG. 11, the base portion 43, the connection portion 44, the vibrator portion 46, and the contact portion 60 are provided along the X axis direction in this order, when seen in the Y axis direction. When seen in the Y axis direction, the base portion 43, the connection portion 44, the vibrator portion 46, and the contact portion are provided along a virtual straight line (not shown) parallel to the X axis, in this order. In the example shown in the drawing, the base portion 43, the connection portion 44, the vibrator portion 46, the contact portion 60, and the rotor 2 are provided along the X axis direction in this order.

The piezoelectric driving device for a motor 300 has, for example, the following characteristics.

In the piezoelectric driving device for a motor 300, the area of a cross section of the connection portion 44 parallel to the YZ plane is smaller than the area of a cross section of the base portion 43 parallel to the YZ plane. Accordingly, in the piezoelectric driving device for a motor 300, even when a position of the vibrating plate 40 with respect to the fixation member 20 varies, a difference between a resonance frequency of longitudinal vibration and a resonance frequency of bending vibration hardly increases, compared to a case where the area of a cross section of the connection portion parallel to the YZ plane is the same as the area of a cross section of the base portion parallel to the YZ plane, for example (for details, see experiment examples which will be described later). As a result, the piezoelectric driving device for a motor 300 can efficiently rotate a rotor. In addition, in the piezoelectric driving device for a motor 300, it is possible to reduce a variation in properties of the piezoelectric driving device, even when a position of the vibrating plate with respect to the fixation member varies, for example.

In the piezoelectric driving device for a motor 300, a size of the connection portion 44 in the Y direction is smaller than a size of the base portion 43 and the vibrator portion 46 in the Y direction. Accordingly, in the piezoelectric driving device for a motor 300, it is possible to set the area of a cross section of the connection portion 44 parallel to the YZ plane to be smaller than the area of a cross section of the base portion 43 parallel to the YZ plane and the area of a cross section of the vibrator portion 46 parallel to the YZ plane.

In the piezoelectric driving device for a motor 300, the connection portion 44 is provided on the positive X axis direction side with respect to the edge 21 of the fixation member 20 on the positive X axis direction side. Therefore, in the piezoelectric driving device for a motor 300, it is possible to reduce a possibility that the connection portion 44 is fixed to the fixation member 20, even when a position of the vibrating plate 40 with respect to the fixation member 20 varies. When the connection portion is fixed to the fixation member, the properties of the piezoelectric driving device for a motor may be largely fluctuated.

In the piezoelectric driving device for a motor 300, the base portion 43, the connection portion 44, the vibrator portion 46, and the contact portion 60 are provided along the X axis direction in this order, when seen in the Y axis direction. Therefore, in the piezoelectric driving device for a motor 300, it is possible to increase a force for pressing the vibrating plate 40 against the rotor 2 and to realize high output. For example, in a case where a rotor is disposed so as to come into contact with a main surface of a vibrating plate (in a case where a contact portion is provided on a main surface of a vibrating plate), the vibrating plate is pressed in a vertical direction of the main surface of the vibrating plate, and accordingly, the vibrating plate may be damaged due to concentration of stress to the boundary of the fixed portion and the connection portion of the vibrating plate, and a force for pressing the vibrating plate may not be increased.

2.2 Manufacturing Method of Piezoelectric Driving Device for Motor

Next, a manufacturing method of the piezoelectric driving device for a motor 300 according to the second embodiment is basically the same as the manufacturing method of the piezoelectric driving device for a motor 100 according to the first embodiment. Therefore, the specific description will be omitted.

Figure 13:
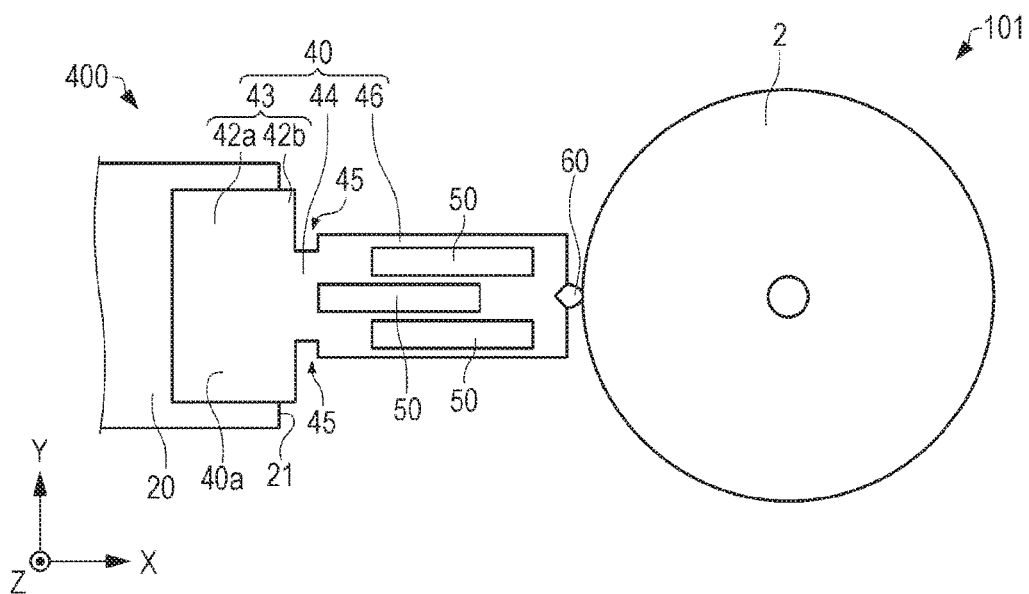
FIG. 13 is a plan view schematically showing a piezoelectric driving device for a motor according to a first modification example of the second embodiment.

2.3. Modification Examples of Piezoelectric Driving Device for Motor 2.3.1 First Modification Example Next, a piezoelectric driving device for a motor according to a first modification example of the second embodiment will be described with reference to the drawings. FIG. 13 is a plan view schematically showing a piezoelectric driving device for a motor 400 according to a first modification example of the second embodiment. In FIG. 13, the substrate 10, the fixation member 20, the spring 30, the wirings 4, 6a, 6b, and 6c, and the terminals 5, 7a, 7b, and 7c are not shown and the piezoelectric element 50 is simplified.

Hereinafter, in the piezoelectric driving device for a motor 400 according to a first modification example of the second embodiment, the same reference numerals are used for members having the same functions as constituent elements of the piezoelectric driving device for a motor 300 according to the second embodiment and the specific description thereof will be omitted. The same applies to a piezoelectric driving devices for a motor according to second and third modification examples of the second embodiment which will be described later.

As shown in FIG. 11, in the piezoelectric driving device for a motor 300 described above, the size of the base portion 43 in the Y axis direction was the same as the size of the vibrator portion 46 in the Y axis direction. With respect to this, as shown in FIG. 13, in the piezoelectric driving device for a motor 400, the size of the base portion 43 in the Y axis direction is greater than the size of the vibrator portion 46 in the Y axis direction. The size of the base portion 43 in the Y axis direction is, for example, from 0.5 mm to 30 mm.

In the piezoelectric driving device for a motor 400, the area of a cross section of the connection portion 44 parallel to the YZ plane is smaller than the area of a cross section of the base portion 43 parallel to the YZ plane, in the same manner as in the piezoelectric driving device for a motor 300. Accordingly, in the piezoelectric driving device for a motor 400, a difference between a resonance frequency of longitudinal vibration and a resonance frequency of bending vibration hardly increases, even when a position of the vibrating plate 40 with respect to the fixation member varies, in the same manner as in the piezoelectric driving device for a motor 300.

2.3.2. Second Modification Example

Figure 14:
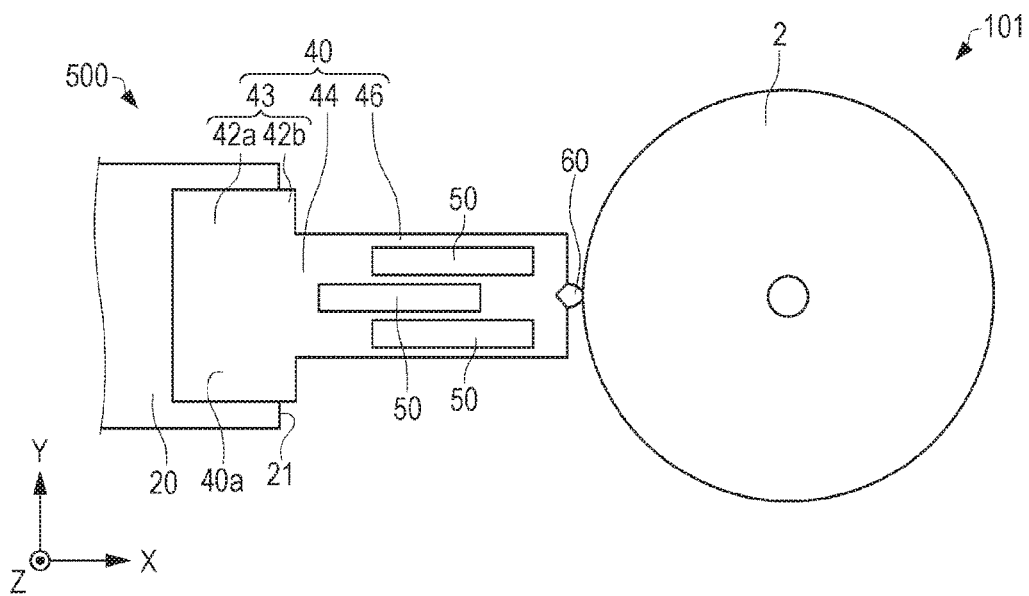
FIG. 14 is a plan view schematically showing a piezoelectric driving device for a motor according to a second modification example of the second embodiment.

Next, a piezoelectric driving device for a motor according to a second modification example of the second embodiment will be described with reference to the drawings. FIG. 14 is a plan view schematically showing a piezoelectric driving device for a motor 500 according to the second modification example of the second embodiment. In FIG. 14, the substrate 10, the fixation member 20, the spring 30, the wirings 4, 6a, 6b, and 6c, and the terminals 5, 7a, 7b, and 7c are not shown and the piezoelectric element 50 is simplified.

As shown in FIG. 11, in the piezoelectric driving device for a motor 300 described above, the size of the base portion 43 in the Y axis direction was the same as the size of the vibrator portion 46 in the Y axis direction. In addition, in the piezoelectric driving device for a motor 300, the size of the connection portion 44 in the Y axis direction was smaller than the size of the vibrator portion 46 in the Y axis direction. With respect to this, as shown in FIG. 14, in the piezoelectric driving device for a motor 500, the size of the base portion 43 in the Y axis direction is greater than the size of the vibrator portion 46 in the Y axis direction. In addition, in the piezoelectric driving device for a motor 500, the size of the connection portion 44 in the Y axis direction is the same as the size of the vibrator portion 46 in the Y axis direction.

In the piezoelectric driving device for a motor 500, the area of a cross section of the connection portion 44 parallel to the YZ plane is smaller than the area of a cross section of the base portion 43 parallel to the YZ plane, in the same manner as in the piezoelectric driving device for a motor 300. Accordingly, in the piezoelectric driving device for a motor 500, a difference between a resonance frequency of longitudinal vibration and a resonance frequency of bending vibration hardly increases, even when a position of the vibrating plate 40 with respect to the fixation member varies, in the same manner as in the piezoelectric driving device for a motor 300 (for details, see experiment examples which will be described later).

2.3.3. Third Modification Example

Figure 15:
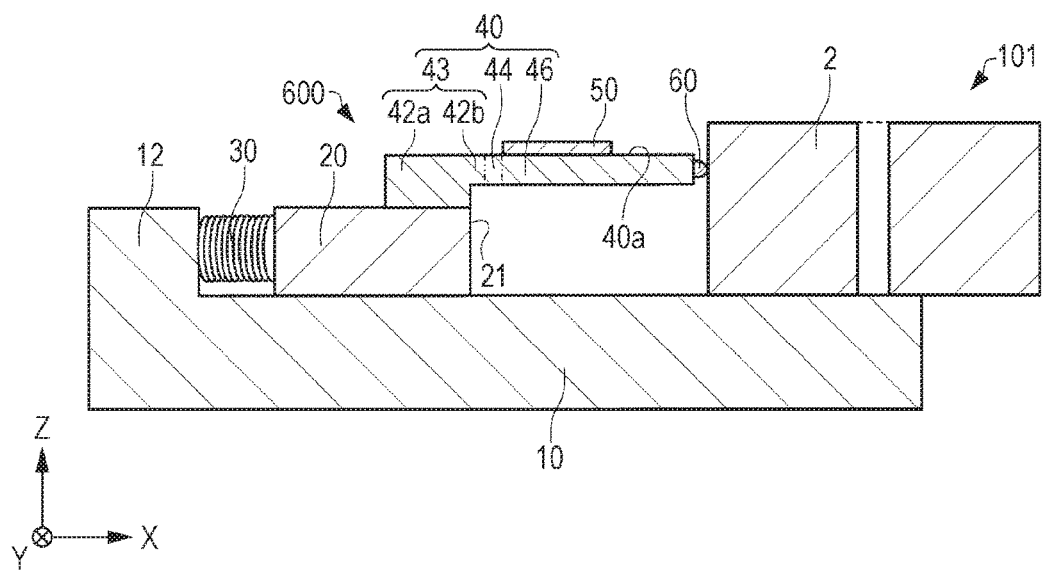
FIG. 15 is a sectional view schematically showing a piezoelectric driving device for a motor according to a third modification example of the second embodiment.

Next, a piezoelectric driving device for a motor according to a third modification example of the second embodiment will be described with reference to the drawings. FIG. 15 is a sectional view schematically showing a piezoelectric driving device for a motor 600 according to the third modification example of the second embodiment. For convenience, in FIG. 15, the piezoelectric element 50 is simplified.

As shown in FIG. 12, in the piezoelectric driving device for a motor 300 described above, the thickness of the base portion 43 was the same as the thickness of the connection portion 44 and the thickness of the vibrator portion 46. With respect to this, as shown in FIG. 15, in the piezoelectric driving device for a motor 600, the thickness of the base portion 43 is greater than the thickness of the connection portion 44 and the thickness of the vibrator portion 46. The thickness of the base portion 43 is, for example, from 0.1 mm to 2 mm.

In the piezoelectric driving device for a motor 600, the area of a cross section of the connection portion 44 parallel to the YZ plane is smaller than the area of a cross section of the base portion 43 parallel to the YZ plane, in the same manner as in the piezoelectric driving device for a motor 300. Accordingly, in the piezoelectric driving device for a motor 600, a difference between a resonance frequency of longitudinal vibration and a resonance frequency of bending vibration hardly increases, even when a position of the vibrating plate 40 with respect to the fixation member varies, in the same manner as in the piezoelectric driving device for a motor 300.

Although not shown, in the piezoelectric driving device for a motor 400 described above, the thickness of the base portion 43 may be set to be greater than the thickness of the connection portion 44 and the thickness of the vibrator portion 46. In addition, in the piezoelectric driving device for a motor 500 described above, the thickness of the base portion 43 may be set to be greater than the thickness of the connection portion 44 and the thickness of the vibrator portion 46.

2.4. Experiment Examples

Hereinafter, experiment examples are shown and the invention will be more specifically described. The invention is not limited to the following experiment examples.

2.4.1 Models Used in Simulation

Figure 16:
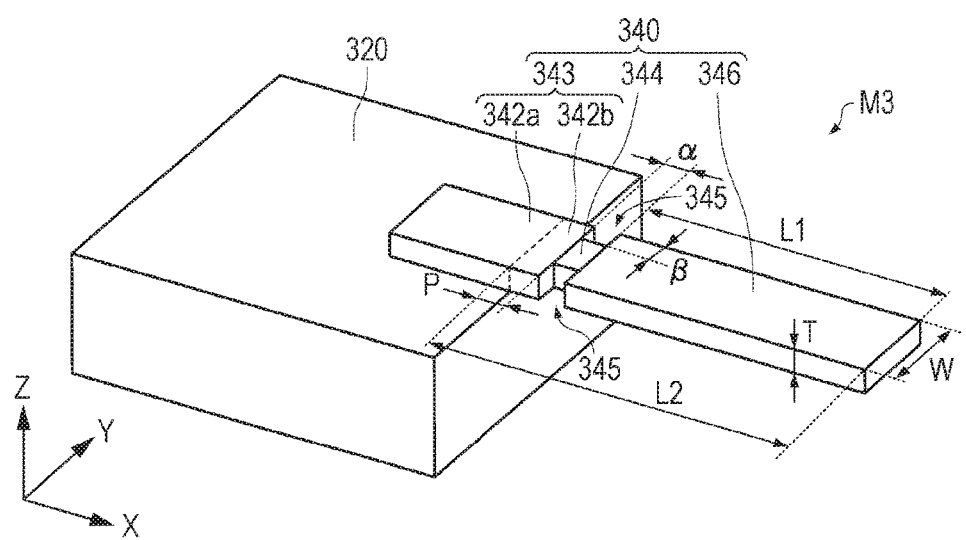
FIG. 16 is a perspective view for illustrating a model used in a simulation.
Figure 17A:
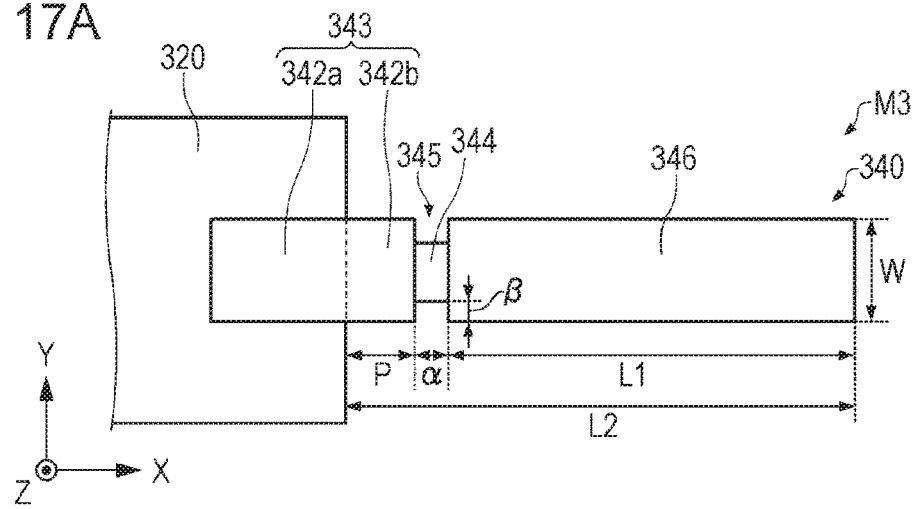
FIG. 17A is a plan view for illustrating a model used in a simulation.
Figure 17B:
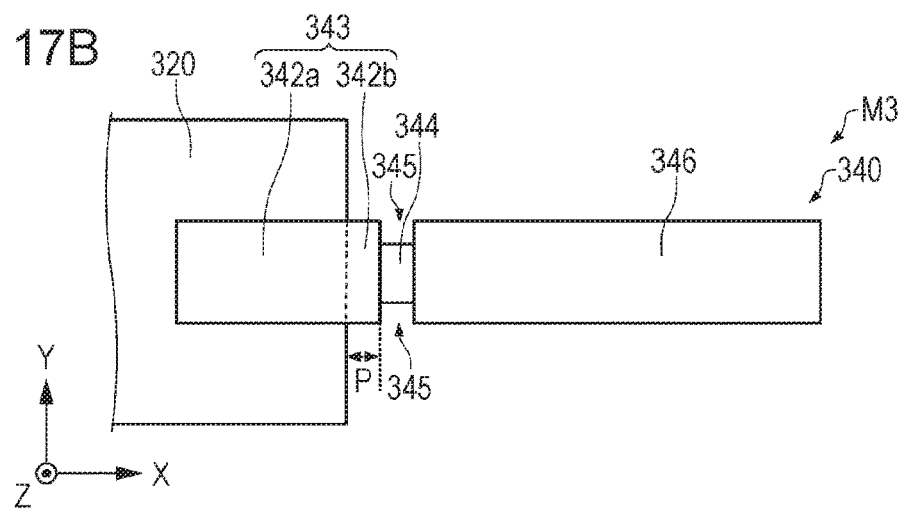
FIG. 17B is a plan view for illustrating a model used in a simulation.
Figure 17C:
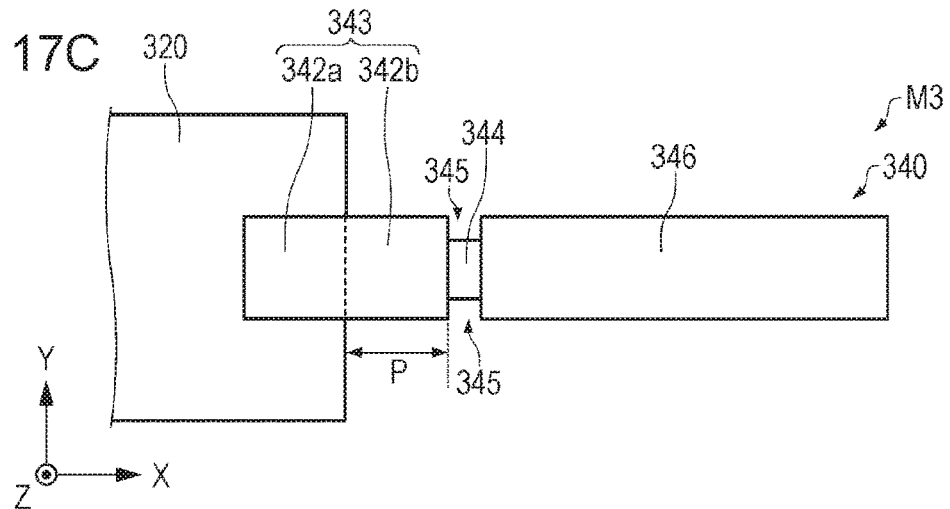
FIG. 17C is a plan view for illustrating a model used in a simulation.

A simulation was performed by using a model M3. The simulation was performed by a finite element method. FIG. 16 is a perspective view for illustrating the model M3 used in a simulation. FIGS. 17A, 17B, and 17C are plan views for illustrating the model M3 used in a simulation.

As shown in FIGS. 16, 17A, 17B, and 17C, in the model M3, a vibrating plate 340 is supported by a fixation member 320 in a cantilever form. The vibrating plate 340 includes a base portion 343 attached to the fixation member 320, a vibrator portion 346 which vibrates, and a connection portion 344 which connects the base portion 343 and the vibrator portion 346 to each other. The base portion 343 includes a first portion 342a overlapped on the fixation member 320 and a second portion 342b which is not overlapped on the fixation member 320, in a plan view. The connection portion 344 is formed by providing cut-out portions 345 in the vibrator portion 346. A material of the vibrator portion 346 is silicon. A material of the fixation member 320 is stainless steel.

The fixation member 320 and the vibrating plate 340 of the model M3 respectively correspond to the fixation member 20 and the vibrating plate 40 of the piezoelectric driving device for a motor 300. The base portion 332, the connection portion 344, and the vibrator portion 346 of the vibrating plate 340 respectively correspond to the base portion 43, the connection portion 44, and the vibrator portion 46 of the vibrating plate 40 of the piezoelectric driving device for a motor 300.

In the model M3, a size L1 (length L1) of the vibrator portion 346 in the X axis direction was set as 2.5 mm. A thickness (size in the Z axis direction) of the vibrating plate 340 was set as 0.2 mm. A size α of the cut-out portion 345 in the X axis direction (length of the cut-out portion 345) was set as 0 mm, 0.1 mm, 0.2 mm, and 0.3 mm. A size β of the cut-out portion 345 in the Y axis direction (depth of the cut-out portion 345) was set as 0 mm, 0.1 mm, 0.2 mm, and 0.3 mm. In a case where α is 0 mm and β is 0 mm, the cut-out portions 345 are not provided, and in this case, a size L2 (length L2) of a portion of the vibrating plate 340 not overlapped with the fixation member 320 in a plan view, in the X axis direction is 2.7 mm.

2.4.2 Relationship Between Position of Vibrating Plate with Respect to Fixation Member and Δf Regarding the model M3 described above, a relationship between a position of the vibrating plate 340 with respect to the fixation member 320 and Δf was investigated. Specifically, as shown in FIG. 17A, a case where a size P of the second portion 342b of the base portion 343 in the X axis direction is 0.2 mm was set as a reference, Δf was calculated for a case where the vibrating plate 340 is moved to the fixation member 320 in the negative X axis direction by 0.1 mm as shown in FIG. 17B (that is, case where P is 0.1 mm) and a case where the vibrating plate 340 is moved to the fixation member 320 in the positive X axis direction by 0.1 mm as shown in FIG. 17C (that is, case where P is 0.3 mm), and a rate of change from the reference was calculated.

Figure 18A:
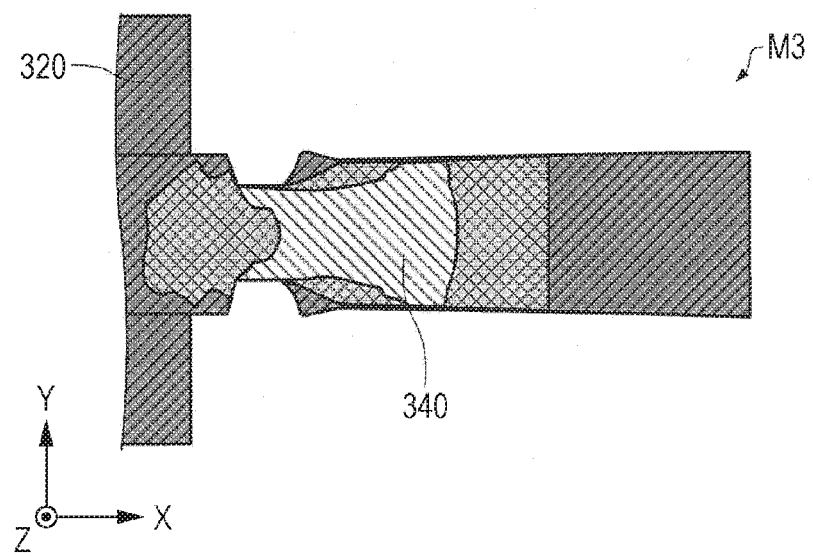
FIG. 18A is a plan view for illustrating vibration of a vibrating plate of a model used in a simulation.
Figure 18B:
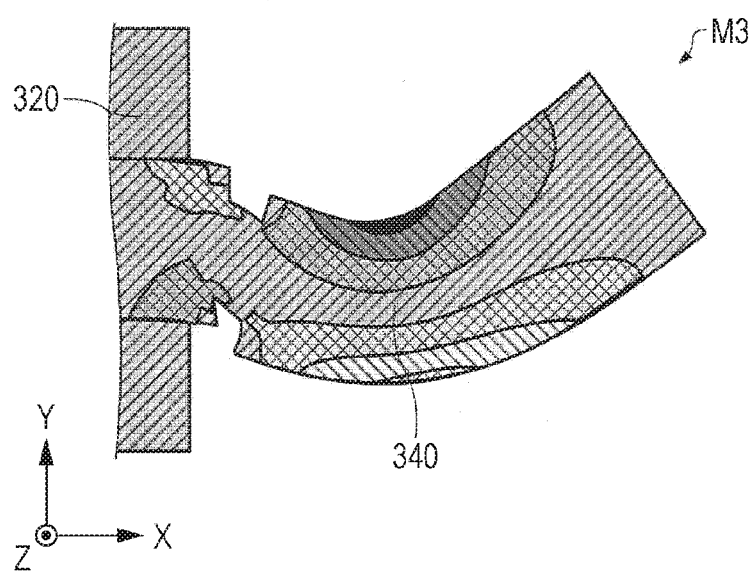
FIG. 18B is a plan view for illustrating vibration of a vibrating plate of a model used in a simulation.

Δf is a difference between a resonance frequency of longitudinal vibration and a resonance frequency of bending vibration of the vibrating plate 340. Specifically, Δf is a value obtained by subtracting a resonance frequency of bending vibration from a resonance frequency of longitudinal vibration. The vibrating plate 340 performs longitudinal vibration (primary longitudinal vibration) in the X axis direction as shown in FIG. 18A, and performs bending vibration (secondary transverse vibration) in the Y axis direction as shown in FIG. 18B. FIGS. 18A and 18B are plan views for illustrating vibration of the vibrating plate 340 of the model M3. FIGS. 18A and 18B shows results of modal analysis and a difference in shades of FIGS. 18A and 18B show a difference in magnitude of stress generated in the model M3.

Figures 19, 20:
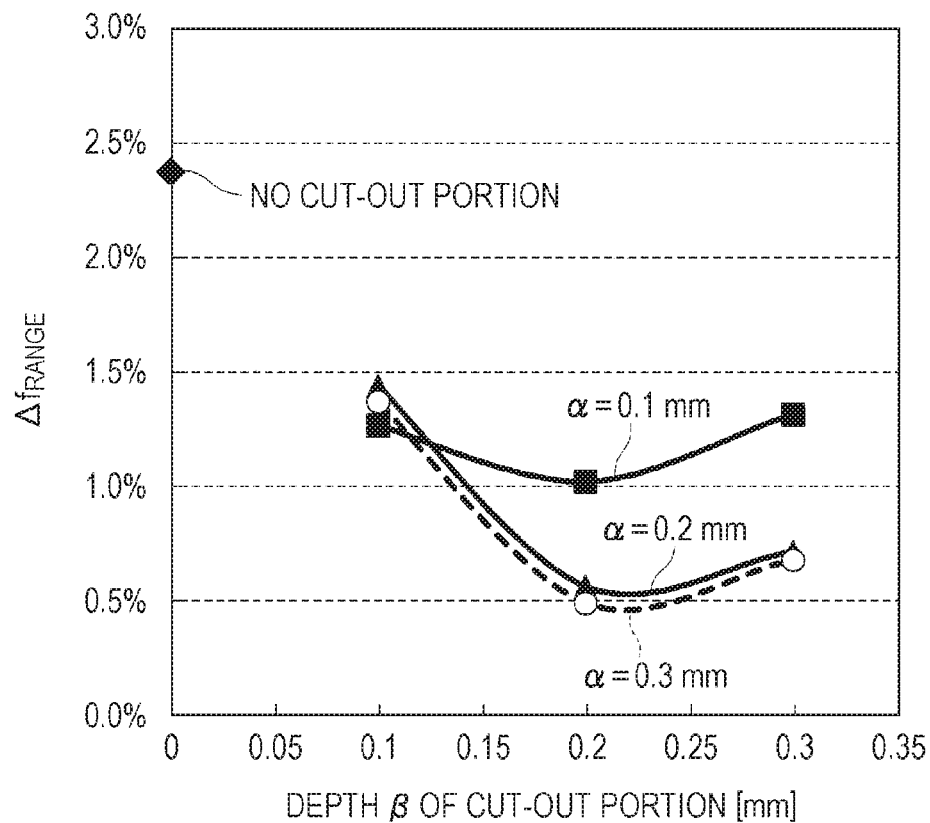
FIG. 19 is a table showing a rate of change in a difference between a resonance frequency in longitudinal vibration and a resonance frequency in bending vibration.
FIG. 20 is a graph showing a rate of change in a difference between a resonance frequency in longitudinal vibration and a resonance frequency in bending vibration.

FIG. 19 is a table showing a rate of change of $\Delta f_{RANGE}$ when the length α and the depth β of the cut-out portion 345 are changed. FIG. 20 is a graph showing plotting of values of the table shown in FIG. 19. $\Delta f_{RANGE}$ is a rate of a variation width of Δf when the vibrating plate 340 with respect to a resonance frequency of longitudinal vibration in the reference state (see FIG. 17A) is changed to the fixation member 320 by ±0.1 mm (see FIGS. 17B and 17C).

From FIG. 19 and FIG. 20, it was found that $\Delta f_{RANGE}$ is decreased in a case where the cut-out portion 345 is provided, compared to a case where the cut-out portion 345 is not provided. An area of a cross section of the connection portion 344 parallel to the YZ plane is smaller than an area of a cross section of the base portion 343 parallel to the YZ plane. Accordingly, it was found that, by setting the area of a cross section of the connection portion 344 parallel to the YZ plane to be smaller than the area of a cross section of the base portion 343 parallel to the YZ plane, a difference between a resonance frequency of longitudinal vibration and a resonance frequency of bending vibration hardly increases, even when a position of the vibrating plate 340 with respect to the fixation member 320 varies.

Particularly, from FIG. 19 and FIG. 20, it was found that, by setting the length α and the depth β of the cut-out portion 345 to be equal to or greater than 0.2 mm, $\Delta f_{RANGE}$ can be smaller than 1%.

Figure 23:
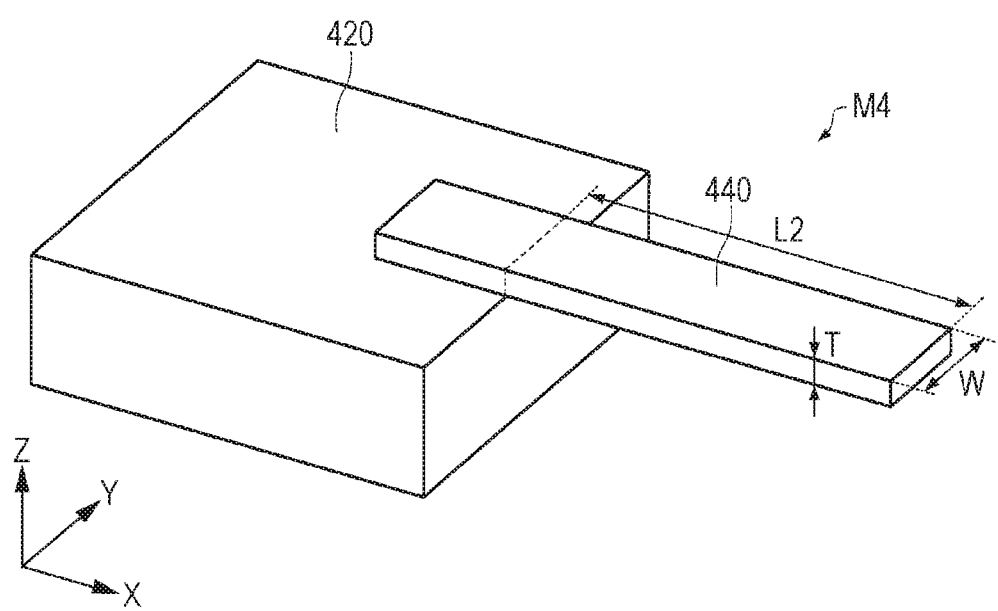
FIG. 23 is a perspective view for illustrating a model used in a simulation.

Herein, a calculation method of $\Delta f_{RANGE}$ will be described with reference to FIG. 21 and FIG. 22. FIG. 21 is a table showing a difference Δf between a resonance frequency in longitudinal vibration and a resonance frequency in bending vibration with respect to the length L2 of a portion of the vibrating plate which is not overlapped with the fixation member (portion which is not overlapped in a plan view). FIG. 22 is a table showing a rate of change of Δf with respect to a rate of change of the length L2 of the vibrating plate and shows values of the table shown in FIG. 21 as rates of change. FIG. 21 and FIG. 22 are results of a simulation using a model M4 shown in FIG. 23. As shown in FIG. 23, the model M4 includes a fixation member 420 and a vibrating plate 440 attached to the fixation member 420 and a cut-out portion is not provided. In the model M4, a size W (width W) of the vibrating plate 440 in the Y axis direction was set as 1.03 mm and a thickness T of the vibrating plate 440 was set as 0.2 mm.

In FIG. 22, a case where L2 is 2.5 mm is set as a reference, and a rate of change from the case of the reference is shown. Specifically, a rate of change of Δf shown in FIG. 22 shows a value obtained by dividing Δf shown in FIG. 21 by a resonance frequency of longitudinal vibration. For example, a rate of change 0.1% of Δf when a rate of change of L2 of FIG. 22 is 0% is a value obtained by dividing "1.2" shown in FIG. 21 by "850.9". For example, a rate of change −1.1% of Δf when a rate of change of L2 of FIG. 22 is −4% is a value obtained by dividing "−9.0" shown in FIG. 21 by "888.0".

$\Delta f_{RANGE}$ described above is a rate of a variation width (maximum value−minimum value) of Δf when L2 is changed by ±0.1 mm from the case of the reference, with respect to a resonance frequency of longitudinal vibration in the case of the reference of L2. Specifically, $\Delta f_{RANGE}$ of the model M2 is (11.2−(−9.0))/850.9=2.37%.

Figure 24:
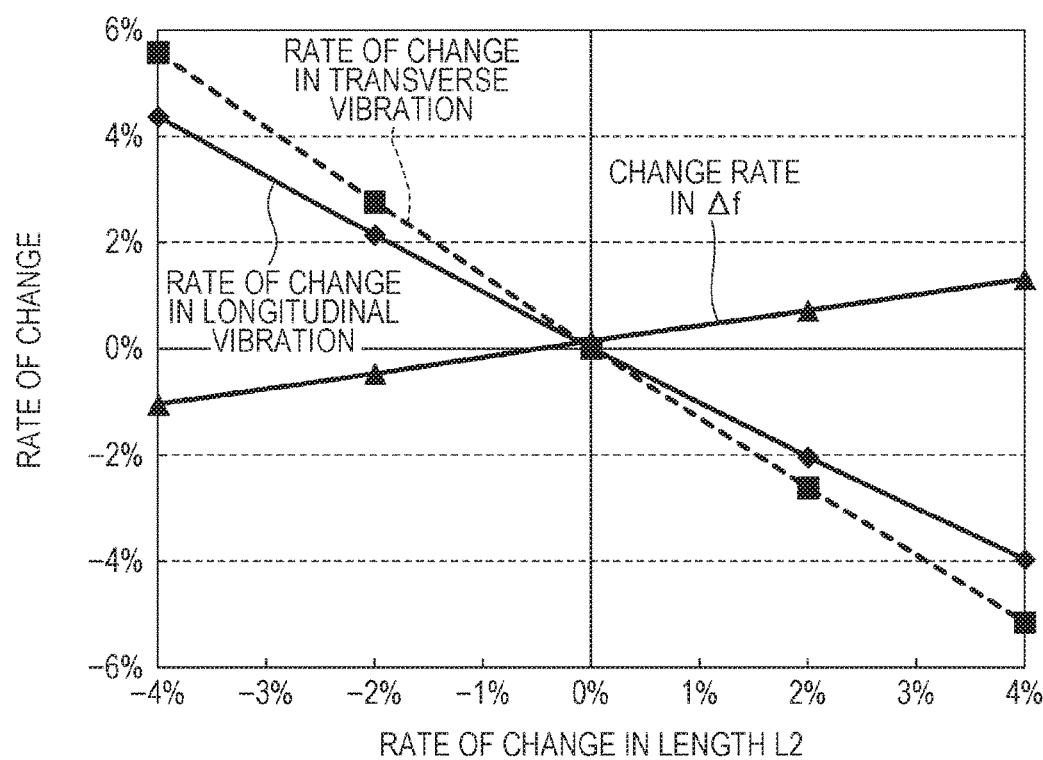
FIG. 24 is a graph showing a rate of change in a difference between a resonance frequency in longitudinal vibration and a resonance frequency in bending vibration.

FIG. 24 is a graph showing a rate of change of Δf when a position of the vibrating plate 440 with respect to the fixation member 420 is changed from a case where L2 is 2.5 mm, in the model M4. In FIG. 24, in a case where the vibrating plate 440 is changed to the fixation member 420 in the negative X axis direction from the case where L2 is 2.5 mm, a position of the vibrating plate 440 with respect to the fixation member 420 is shown by using "−", and in a case where the vibrating plate 440 is changed to the fixation member 420 in the positive X axis direction, a position of the vibrating plate 440 with respect to the fixation member 420 is shown by using "+". In FIG. 24, for example, "4%" of a horizontal axis indicates a case where L2 is 2.6 mm and "−4%" of a horizontal axis indicates a case where L2 is 2.4 mm. In FIG. 24, a rate of change of longitudinal vibration and a rate of change of bending vibration are also plotted.

Figure 25:
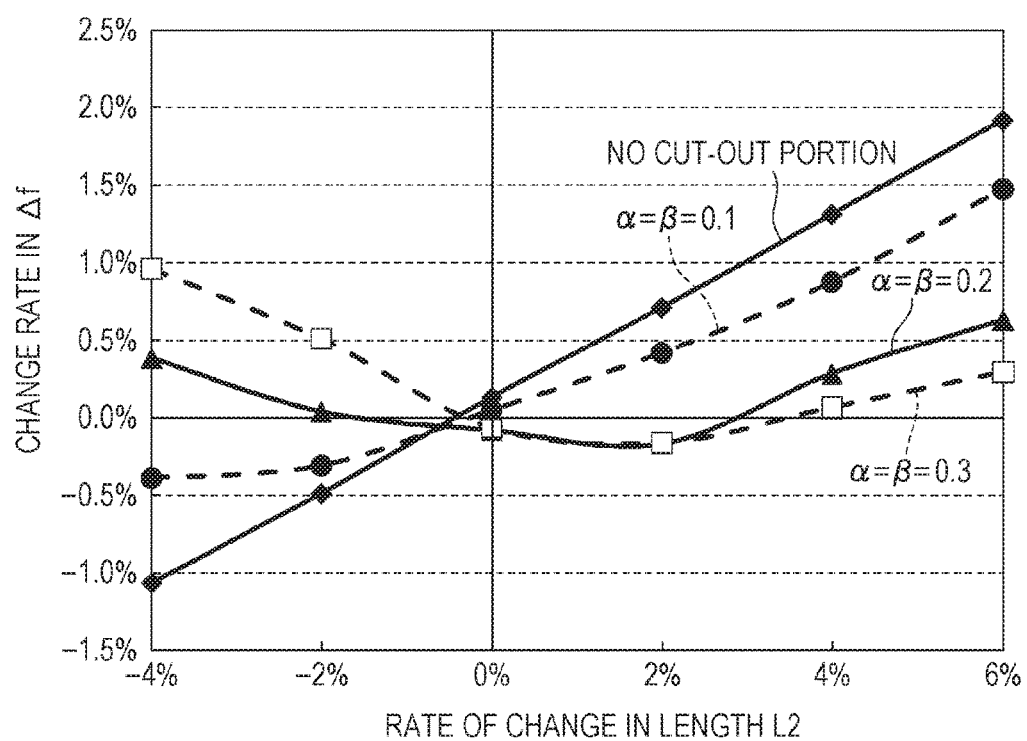
FIG. 25 is a graph showing a rate of change in a difference between a resonance frequency in longitudinal vibration and a resonance frequency in bending vibration.

FIG. 25 is a graph showing a rate of change of Δf when a position of a vibrating plate with respect to a base portion is changed. A result shown with "no cut-out portion" in FIG. 25 is calculated by using the model M4. In FIG. 25, results shown with "α=β=0.1 mm", "α=β=0.2 mm", and "α=β=0.3 mm" are calculated by using the model M3. That is, in the case of "no cut-out portion", L2 is 2.5 mm, and in the cases of "α=β=0.1 mm", "α=β=0.2 mm", and "α=β=0.3 mm", L2 is 2.7+β. As described above, α is a length of the cut-out portion 345 and β is a depth of the cut-out portion 345.

From FIG. 25, it was found that it is possible to decrease a rate of change of Δf, by providing the cut-out portion 345. It is preferable that a width (range) of a rate of change of Δf is controlled to be within ±1%.

FIG. 26 is a table showing a rate of change of $\Delta f_{RANGE}$ when the length α and the depth β of the cut-out portion 345 are changed in the model M3. In FIG. 26, a "sectional area" means an area of a cross section parallel to the YZ plane. FIG. 26 also shows a decreasing rate of a sectional area A (A=1−"area of connection portion 344"/"area of vibrator portion 346"), a cut-out length rate B (B=α/L1), and a value of A×B.

Figure 27:
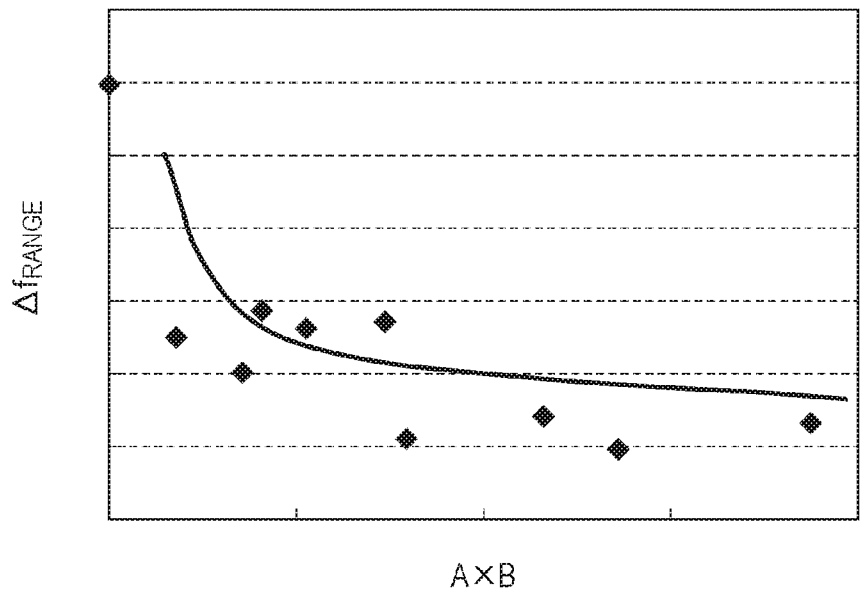
FIG. 27 is a graph showing a rate of change in a difference between a resonance frequency in longitudinal vibration and a resonance frequency in bending vibration.
Figure 28:
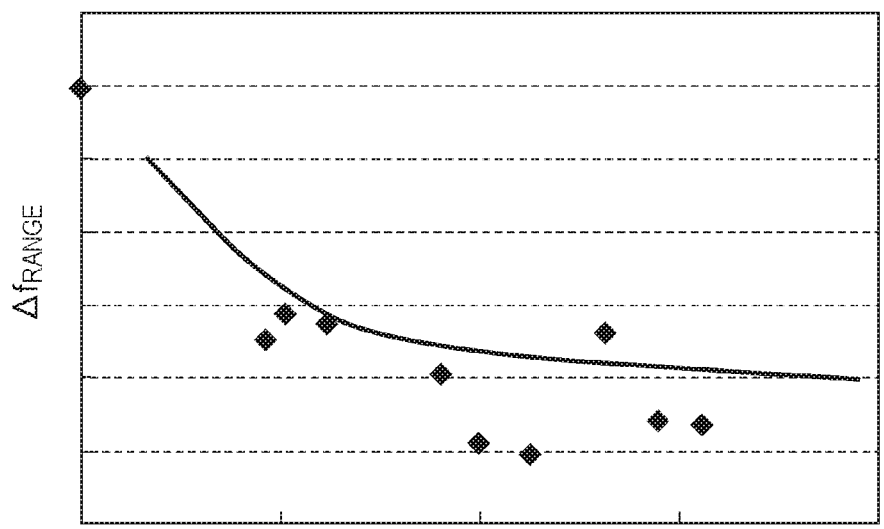
FIG. 28 is a graph showing a rate of change in a difference between a resonance frequency in longitudinal vibration and a resonance frequency in bending vibration.

FIG. 27 is a graph showing plotting of a value of A×B shown in FIG. 26 and $\Delta f_{RANGE}$. FIG. 28 is a graph showing plotting of A of the table shown in FIG. 26 and $\Delta f_{RANGE}$.

From FIG. 26 and FIG. 27, it was found that, by setting the value of A×B to be equal to or greater than 0.032, $\Delta f_{RANGE}$ can be equal to or smaller than 1%.

When the sectional area of the connection portion 344 is excessively small, strength of the connection portion 344 may be decreased. In addition, when the sectional area of the connection portion 344 is excessively small, it may be difficult to provide wirings for applying a voltage to a piezoelectric element. For example, in a case where L1 is 2.5 mm and W is 1 mm, the dimensions of α as 0.3 mm and β as 0.4 mm (width of connection portion 344 is 0.2 mm) can be realized. At this time, the decreasing rate of a sectional area A is 0.8, the cut-out length rate B is 0.12, and the value of A×B is 0.096.

Figures 29, 30:
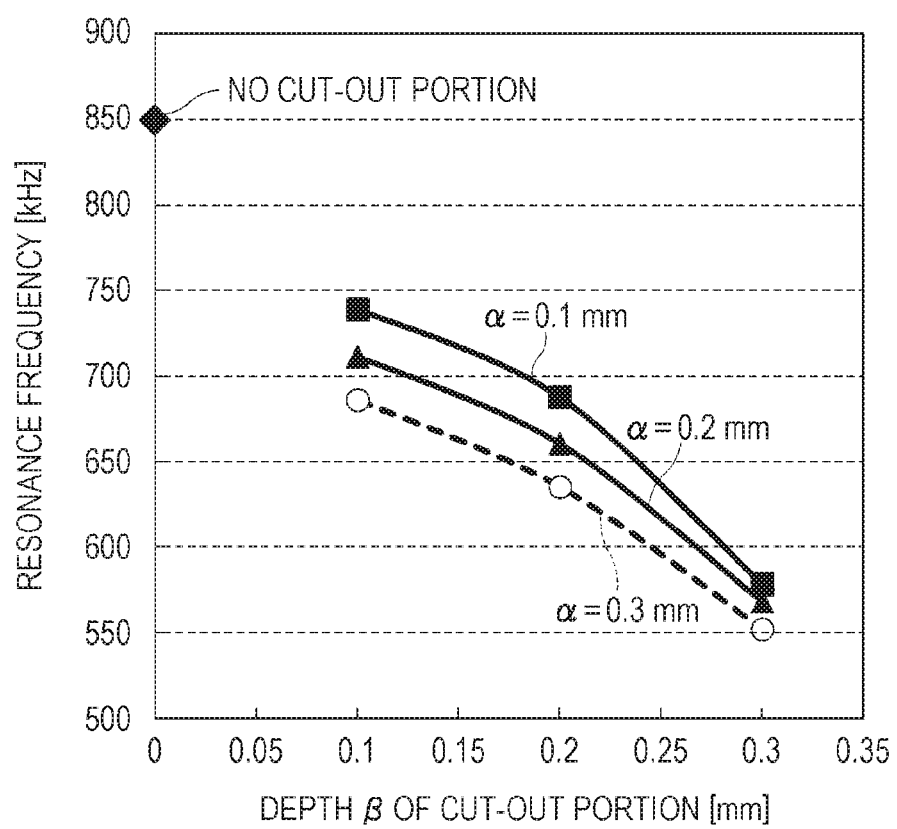
FIG. 29 is a table showing a resonance frequency in longitudinal vibration.
FIG. 30 is a graph showing a resonance frequency in longitudinal vibration.

2.4.3. Relationship Between Cut-Out Portion and Absolute Value of Resonance Frequency FIG. 29 is a table showing a resonance frequency (kHz) of longitudinal vibration, when the length α and the depth β of the cut-out portion 345 are changed in the model M3. However, in FIG. 29, a result in a case where α=β=0 (no cut-out portion) is a value calculated by using the model M4. FIG. 30 is a graph showing plotting of values of the table shown in FIG. 29.

From FIG. 29 and FIG. 30, it was found that, by providing the cut-out portion 345, it is possible to decrease a resonance frequency. For example, in a case of no cut-out portion, the resonance frequency is 850.9 kHz, whereas in a case where the length α and the depth β of the cut-out portion 345 are 0.2 mm (case where α=β=0.2 mm), the resonance frequency is 660.8 kHz. Accordingly, in a case where α=β=0.2 mm, the resonance frequency was lower than the case of no cut-out portion by 20% or more. When the resonance frequency is low, it is possible to decrease a driving current for driving a piezoelectric driving device for a motor and to decrease a loss due to impedance. Accordingly, by providing a cut-out portion, it is possible to decrease power consumption and to realize low cost.

2.4.4 Simulation Using Other Models

Figure 31:
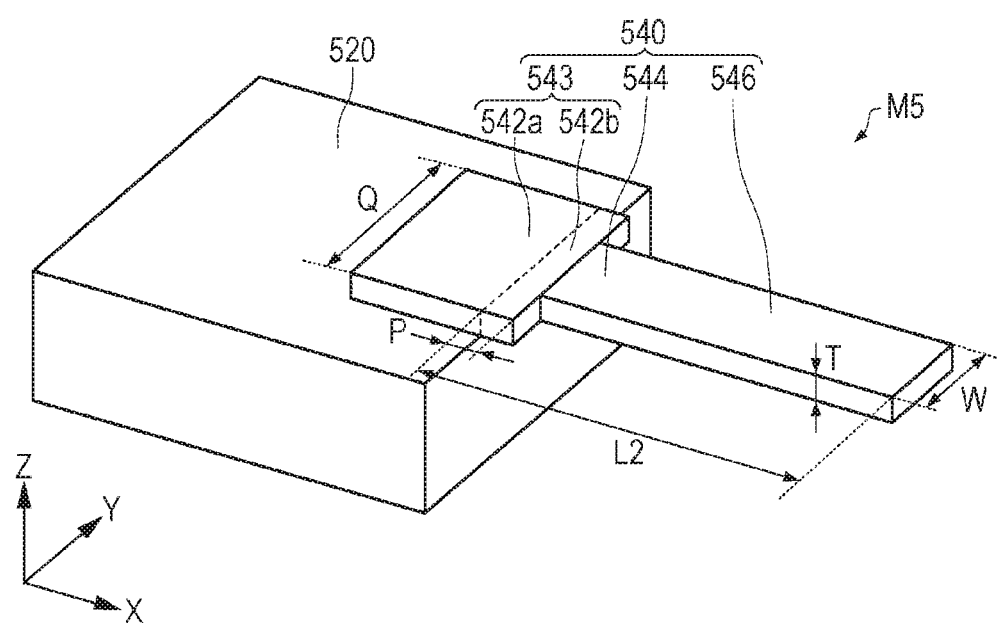
FIG. 31 is a perspective view for illustrating a model used in a simulation.

A simulation was performed by using a model M5. FIG. 31 is a perspective view for illustrating the model M5 used in a simulation. As shown in FIG. 31, in the model M5, a vibrating plate 540 is supported by a fixation member 520 in a cantilever form. The vibrating plate 540 includes a base portion 542 attached to the fixation member 520, a vibrator portion 546 which vibrates, and a connection portion 544 which connects the base portion 543 and the vibrator portion 546 to each other. The base portion 543 includes a first portion 542a overlapped on the fixation member 520 and a second portion 542b which is not overlapped on the fixation member 520, in a plan view. A material of the vibrator portion 546 is silicon. A material of the fixation member 520 is stainless steel.

The fixation member 520 and the vibrating plate 540 of the model M5 respectively correspond to the fixation member 20 and the vibrating plate 40 of the piezoelectric driving device for a motor 500. The base portion 543, the connection portion 544, and the vibrator portion 546 of the vibrating plate 540 respectively correspond to the base portion 43, the connection portion 44, and the vibrator portion 46 of the vibrating plate 40 of the piezoelectric driving device for a motor 500.

In the model M5, the length L2 of a portion of the vibrating plate 540 not overlapped with the fixation member 520 in a plan view, in the X axis direction was set as 2.7 mm. A size W of the vibrator portion 546 in the Y axis direction was set as 0.975 mm. A size Q of the base portion 542 in the Y axis direction was set as 1.975 mm. A thickness T of the vibrating plate 540 was set as 0.2 mm. A size P of the second portion 542b of the base portion 543 in the X axis direction was set as 0.2 mm.

Figure 32:
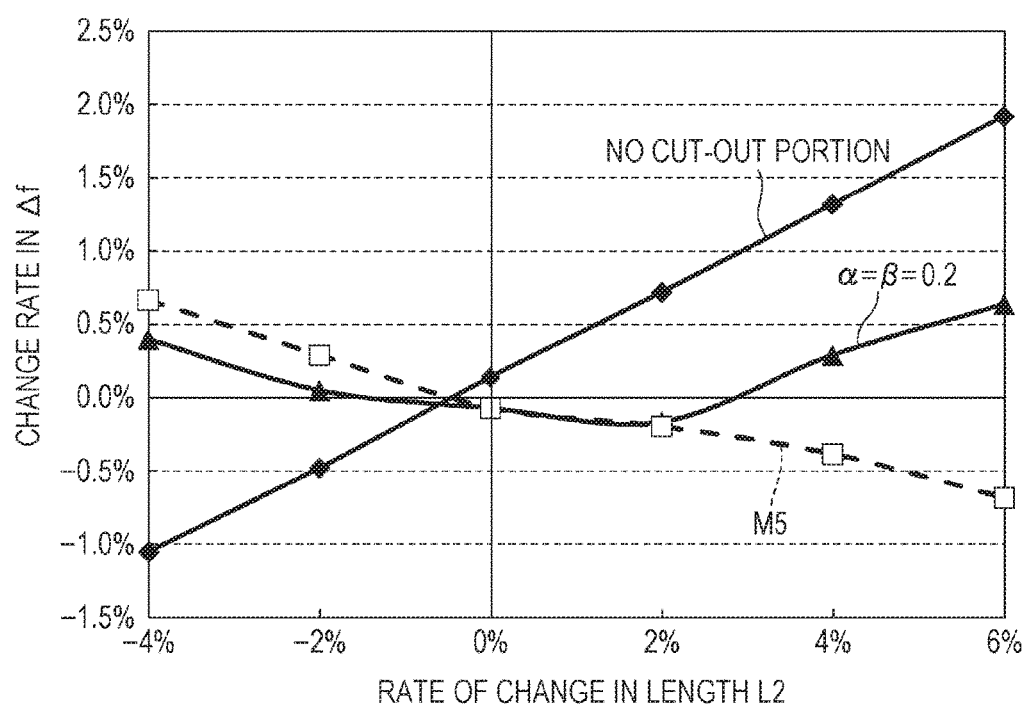
FIG. 32 is a graph showing a rate of change in a difference between a resonance frequency in longitudinal vibration and a resonance frequency in bending vibration.

FIG. 32 is a graph showing a rate of change of Δf when a position of the vibrating plate with respect to a base portion is changed. In FIG. 32, a result shown with "M5" is a value calculated by using the model M5 described above, a result shown with "no cut-out portion" is the same data (plot) as the result shown with "no cut-out portion" shown in FIG. 25, and a result shown with "α=β=0.2" of FIG. 32 is the same data as the result shown with "α=β=0.2" shown in FIG. 25.

From FIG. 32, it was found that, by setting the size of the base portion in the Y axis direction to be greater than the size of the connection portion in the Y axis direction, it is possible to decrease a rate of change of Δf, even when the area of a cross section of the connection portion parallel to the YZ plane is set to be smaller than the area of a cross section of the base portion parallel to the YZ plane.

3. Third Embodiment

The piezoelectric driving device for a motor according to the invention can apply great force to a driven body by using resonance and can be applied to various devices. The piezoelectric driving device according to the invention can be used as a driving device in various apparatuses such as a robot (including electronic component conveying apparatus (IC handler)), a pump for medication, a calendar transporting apparatus of a clock, and a paper feeding mechanism of a printing apparatus, for example. Hereinafter, a representative embodiment will be described. Hereinafter, an apparatus including the piezoelectric driving device for a motor 100 will be described as the piezoelectric driving device for a motor according to the invention.

3.1. Robot

Figure 33:
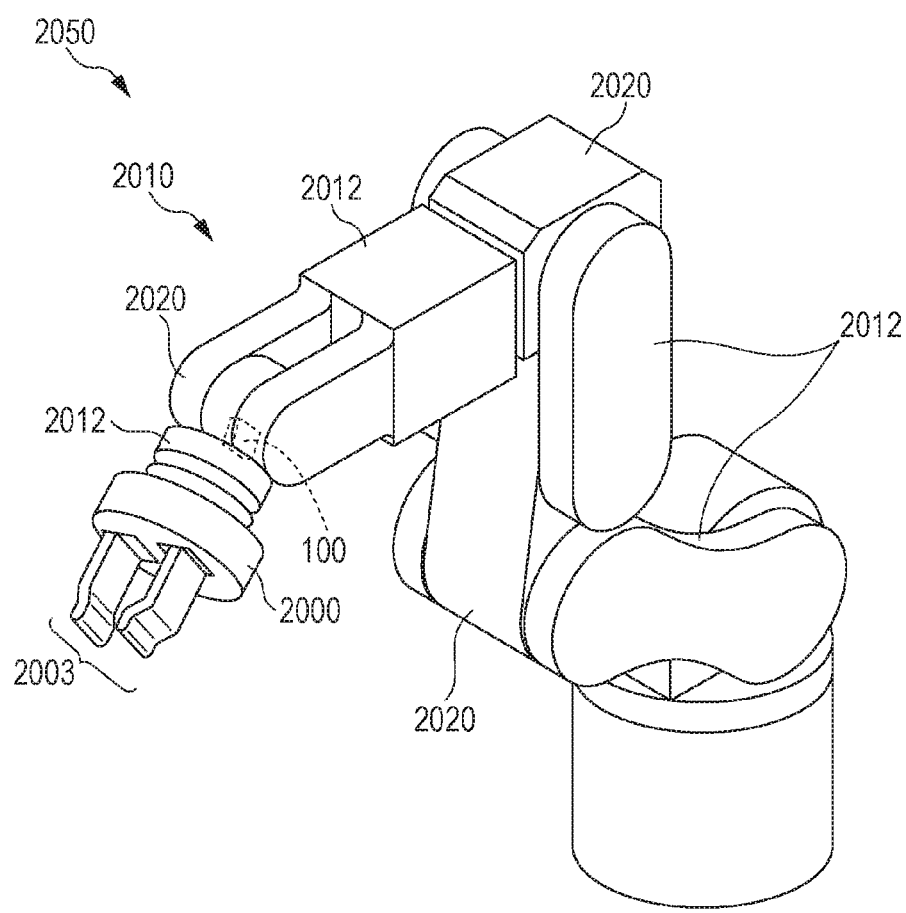
FIG. 33 is a diagram for illustrating a robot according to a third embodiment.

FIG. 33 is a diagram for illustrating a robot 2050 using the piezoelectric driving device for a motor 100. The robot 2050 includes an arm 2010 (also referred to as an "arm portion") which includes a plurality of linking portions 2012 (also referred to as "linking members") and a plurality of joints 2020 which are connected between the linking portions 2012 to be rotated or curved.

The piezoelectric driving device for a motor 100 is embedded in each joint 2020, and it is possible to rotate or curve the joint 2020 by an arbitrary angle using the piezoelectric driving device for a motor 100. A robot hand 2000 is connected to an end of the arm 2010. The robot hand 2000 includes a pair of grasping portions 2003. The piezoelectric driving device for a motor 100 is also embedded in the robot hand 2000, and it is possible to open and close the grasping portions 2003 using the piezoelectric driving device for a motor 100 to grasp an object. In addition, the piezoelectric driving device for a motor 100 is also provided between the robot hand 2000 and the arm 2010, and it is possible to rotate the robot hand 2000 with respect to the arm 2010 using the piezoelectric driving device for a motor 100.

Figure 34:
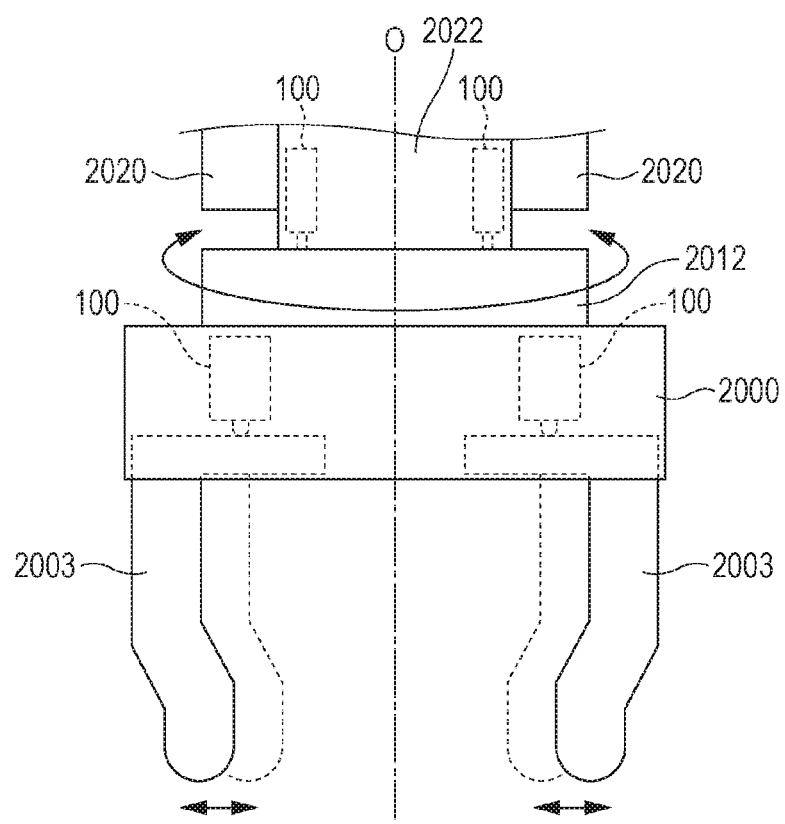
FIG. 34 is a diagram for illustrating a wrist part of a robot according to the third embodiment.

FIG. 34 is an explanatory diagram of a wrist part of the robot 2050 shown in FIG. 33. The wrist joints 2020 interpose a wrist rotation portion 2022 and a wrist linking portion 2012 is attached to the wrist rotation portion 2022 to be rotated around a center axis O of the wrist rotation portion 2022. The wrist rotation portion 2022 includes the piezoelectric driving device for a motor 100, and the piezoelectric driving device for a motor 100 rotates the wrist linking portion 2012 and the robot hand 2000 around the center axis O. The plurality of grasping portions 2003 are provided to stand on the robot hand 2000. A proximal end portion of the grasping portion 2003 can move in the robot hand 2000 and the piezoelectric driving device for a motor 100 is mounted in a base portion of this grasping portion 2003. Accordingly, by operating the piezoelectric driving device for a motor 100, it is possible to grasp a target by moving the grasping portion 2003. The robot is not limited to a single arm robot, and the piezoelectric driving device for a motor 100 can also be applied to a multi-arm robot having two or more arms.

Herein, in addition to the piezoelectric driving device for a motor 100, an electric power line for applying power to various devices such as a force sensor or a gyro sensor or a signal line for transmitting signals to the devices is included in the wrist joints 2020 or the robot hand 2000, and an extremely large number of wirings are necessary. Accordingly, it was extremely difficult to dispose wirings in the joints 2020 or the robot hand 2000. However, since the piezoelectric driving device for a motor 100 can decrease a driving current, compared to a general electric motor, it is possible to dispose wirings even in a small space such as the joint 2020 (particularly, a joint on the edge of the arm 2010) or the robot hand 2000.

3.2. Pump

Figure 35:
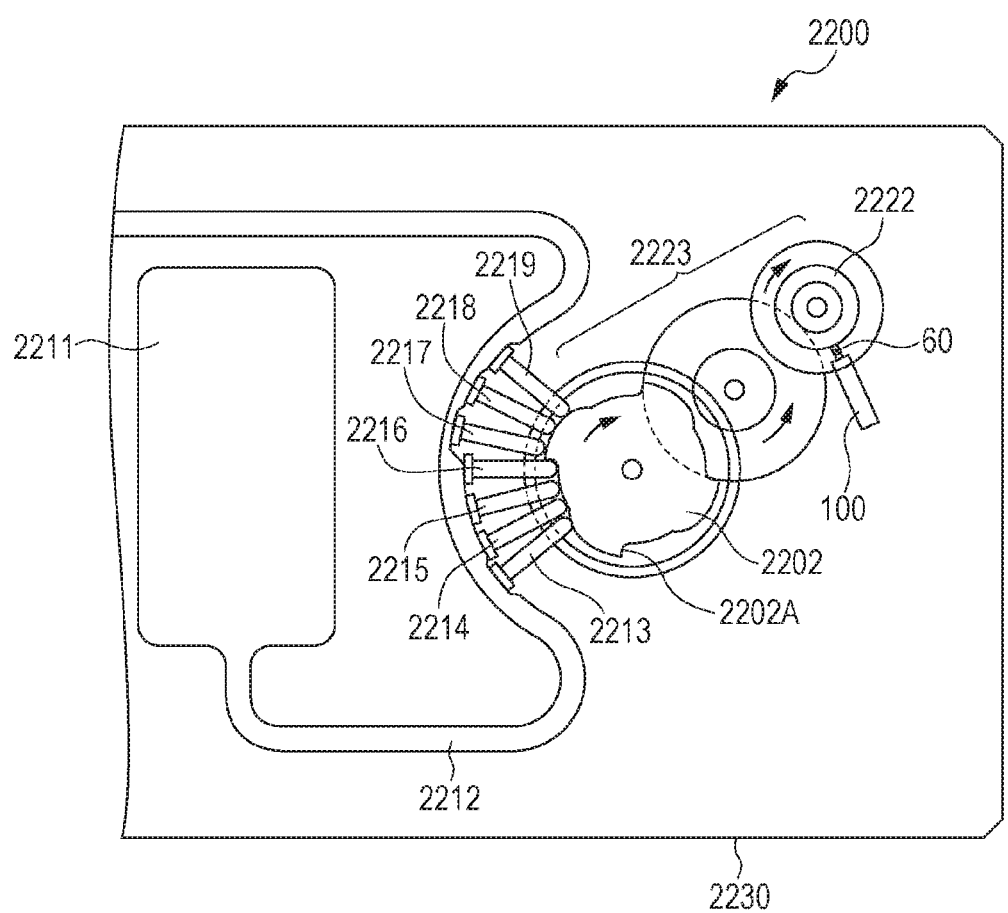
FIG. 35 is a diagram for illustrating a pump according to the third embodiment.

FIG. 35 is a diagram for illustrating an example of a liquid feeding pump 2200 using the piezoelectric driving device for a motor 100. The liquid feeding pump 2200 includes a reservoir 2211, a tube 2212, the piezoelectric driving device for a motor 100, a rotor 2222, a deceleration transmission mechanism 2223, a cam 2202, and a plurality of fingers 2213, 2214, 2215, 2216, 2217, 2218, and 2219 in a case 2230.

The reservoir 2211 is an accommodation portion which accommodates liquid which is a transportation target. The tube 2212 is a tube which transports the liquid sent from the reservoir 2211. The contact portion 60 of the piezoelectric driving device for a motor 100 is provided in a state of being pressed against a side surface of the rotor 2222 and the piezoelectric driving device for a motor 500 rotates the rotor 2222. A rotation force of the rotor 2222 is transmitted to the cam 2202 through the deceleration transmission mechanism 2223. The fingers 2213 to 2219 are members which block the tube 2212. When the cam 2202 is rotated, the fingers 2213 to 2219 are pressed to the outer side in an emission direction in order, by a protrusion 2202A of the cam 2202. The fingers 2213 to 2219 block the tube 2212 in order from the upstream side in a transportation direction (reservoir 2211 side). Accordingly, the liquid in the tube 2212 is transmitted to the downstream side in order. By doing so, it is possible to accurately feed an extremely small amount of liquid and to realize a small liquid feeding pump 2200.

The disposition of each member is not limited to that shown in the drawing. The members such as fingers or the like may not be provided and a ball or the like provided on the rotor 2222 may block the tube 2212. The liquid feeding pump 2200 described above can be used as a dosing apparatus which gives medication such as insulin to a human body. Herein, by using the piezoelectric driving device for a motor 100, a driving current can be decreased, compared to a case of a general electric motor, and accordingly, it is possible to decrease power consumption of the dosing apparatus. Thus, when the dosing apparatus is driven with a battery, the effects are particularly effective.

The embodiments and modification examples described above are merely examples and there is no limitation. For example, each embodiment and each modification example can be suitably combined with each other.

The invention includes substantially the same configuration (for example, the configuration with the same function, method, and result, or the configuration with the same object and effect) as the configuration described in the embodiments. The invention includes the configuration obtained by replacing the non-substantial part of the configuration described in the embodiments. The invention includes the configuration which realizes the same action effect as the configuration described in the embodiments or the configuration which can achieve the same object. The invention includes the configuration obtained by adding a well-known technology to the configuration described in the embodiments.

The entire disclosures of Japanese Patent Application No. 2015-119672, filed Jun. 12, 2015 and Japanese Patent Application No. 2015-119673, filed Jun. 12, 2015 are expressly incorporated by reference herein.

What is claimed is:

1. A piezoelectric driving device for a motor comprising:
   a vibrating plate which includes a fixed portion and a vibrator portion in which a piezoelectric element is provided and which is supported by the fixed portion; and
   a contact portion which comes into contact with a driven body and transmits motion of the vibrating plate to the driven body,
   wherein the vibrating plate is formed of a silicon substrate, and
   wherein the fixed portion, the vibrator portion, and the contact portion are provided along an X direction in this order, when seen in a Y direction, when two directions parallel to a main surface of the vibrating plate and orthogonal to each other are set as the X direction and the Y direction and a direction orthogonal to the main surface of the vibrating plate is set as a Z direction.

2. The piezoelectric driving device for a motor according to claim 1,
   wherein a terminal electrically connected to electrodes of the piezoelectric element is provided in the fixed portion.

3. The piezoelectric driving device for a motor according to claim 1,
   wherein a plurality of piezoelectric elements are provided in the vibrator portion so as to generate longitudinal vibration in the X direction and bending vibration in the Y direction.

4. The piezoelectric driving device for a motor according to claim 1,
   wherein the plurality of vibrating plates are stacked in the Z direction.

5. A motor comprising:
   the piezoelectric driving device for a motor according to claim 1; and
   a rotor which is rotated by the piezoelectric driving device for a motor.

6. A motor comprising:
   the piezoelectric driving device for a motor according to claim 2; and
   a rotor which is rotated by the piezoelectric driving device for a motor.

7. A motor comprising:
   the piezoelectric driving device for a motor according to claim 3; and
   a rotor which is rotated by the piezoelectric driving device for a motor.

8. A motor comprising:
   the piezoelectric driving device for a motor according to claim 4; and
   a rotor which is rotated by the piezoelectric driving device for a motor.

9. A robot comprising:
   a plurality of linking portions;
   a joint which connects the plurality of linking portions to each other; and
   the piezoelectric driving device for a motor according to claim 1 which rotates the plurality of linking portions by using the joint.

10. A pump comprising:
    the piezoelectric driving device for a motor according to claim 1;
    a tube which transports liquid; and
    a plurality of fingers which close the tube by driving the piezoelectric driving device for a motor.

11. A piezoelectric driving device for a motor comprising:
    a vibrating plate including a base portion, a vibrator portion in which a piezoelectric element is provided, and a connection portion which connects the base portion and the vibrator portion to each other; and
    a contact portion which comes into contact with a driven body and transmits motion of the vibrating plate to the driven body,
    wherein the vibrating plate is formed of a silicon substrate,
    the base portion, the connection portion, and the vibrator portion are provided along an X direction in this order, when seen in a Y direction, when two directions parallel to a main surface of the vibrating plate and orthogonal to each other are set as the X direction and the Y direction, a direction orthogonal to the main surface of the vibrating plate is set as a Z direction, and a surface including the Y direction and the Z direction is set as a YZ plane, and
    an area of a cross section of the connection portion parallel to the YZ plane is smaller than an area of a cross section of the base portion parallel to the YZ plane.

12. The piezoelectric driving device for a motor according to claim 11,
    wherein the area of the cross section of the connection portion parallel to the YZ plane is smaller than an area of a cross section of the vibrator portion parallel to the YZ plane.

13. The piezoelectric driving device for a motor according to claim 11,
    wherein a size of the connection portion in the Y direction is smaller than a size of the base portion and the vibrator portion in the Y direction.

14. The piezoelectric driving device for a motor according to claim 11, further comprising:
   a fixation member to which the base portion of the vibrating plate is attached,
   wherein the connection portion is provided in a positive X direction with respect to the edge of the fixation member in the positive X direction, when a direction from the base portion towards the vibrator portion side is set as the positive X direction.

15. The piezoelectric driving device for a motor according to claim 11,
   wherein a plurality of piezoelectric elements are provided in the vibrator portion so as to generate longitudinal vibration in the X direction and bending vibration in the Y direction.

16. The piezoelectric driving device for a motor according to claim 11,
   wherein the base portion, the connection portion, the vibrator portion, and the contact portion are provided along the X direction in this order, when seen in the Y direction.

17. A motor comprising:
   the piezoelectric driving device for a motor according to claim 11; and
   a rotor which is rotated by the piezoelectric driving device for a motor.

18. A motor comprising:
   the piezoelectric driving device for a motor according to claim 12; and
   a rotor which is rotated by the piezoelectric driving device for a motor.

* * * * *